US006945788B2

United States Patent
Trout et al.

(10) Patent No.: US 6,945,788 B2
(45) Date of Patent: Sep. 20, 2005

(54) METAL CONTACT LGA SOCKET

(75) Inventors: David A. Trout, Lancaster, PA (US); Jeffrey B. McClinton, Harrisburg, PA (US); Keith M. Murr, Etters, PA (US); Peter C. O'Donnell, Dillsburg, PA (US); Hollis P. Raymond, Mechanicsburg, PA (US); David B. Sinisi, Harrisburg, PA (US); Attalee S. Taylor, Palmyra, PA (US); Andrew D. Balthaser, Dauphin, PA (US); Richard N. Whyne, Camp Hill, PA (US); Darrell L. Wertz, York, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/788,880

(22) Filed: Feb. 27, 2004

(65) Prior Publication Data

US 2005/0026503 A1 Feb. 3, 2005

Related U.S. Application Data

(60) Provisional application No. 60/491,493, filed on Jul. 31, 2003.

(51) Int. Cl.$^7$ ............................................. H01R 12/00
(52) U.S. Cl. ...................................................... 439/66
(58) Field of Search ............................. 439/66, 71, 74

(56) References Cited

U.S. PATENT DOCUMENTS

| | | | |
|---|---|---|---|
| 4,927,369 A | 5/1990 | Grabbe et al. | 439/66 |
| 5,152,695 A | 10/1992 | Grabbe et al. | 439/71 |
| 5,228,861 A | 7/1993 | Grabbe | 439/66 |
| 5,380,210 A * | 1/1995 | Grabbe et al. | 439/66 |
| 5,395,252 A | 3/1995 | White | 439/66 |
| 5,427,535 A | 6/1995 | Sinclair | 439/66 |
| 5,462,440 A | 10/1995 | Rothenberger | 439/66 |
| 5,498,166 A | 3/1996 | Rothenberger | 439/66 |
| 5,653,598 A | 8/1997 | Grabbe | 439/66 |
| 5,893,761 A | 4/1999 | Longueville | 439/66 |
| 6,146,151 A | 11/2000 | Li | 439/66 |
| 6,186,797 B1 | 2/2001 | Wang et al. | 439/66 |
| 6,247,938 B1 | 6/2001 | Rathburn | 439/66 |
| 6,315,576 B1 | 11/2001 | Neidich | 439/66 |
| 6,375,474 B1 * | 4/2002 | Harper, Jr. et al. | 439/66 |
| 6,442,045 B1 | 8/2002 | Goodwin et al. | 361/816 |
| 6,699,047 B1 * | 3/2004 | McHugh et al. | 439/71 |

* cited by examiner

*Primary Examiner*—Ross Gushi

(57) ABSTRACT

A socket is provided which has an insulative housing surrounding a metal substrate. The substrate has an array of apertures which are located in spatially arranged order to accommodate the precise pattern desired for the device to be connected. Contact assemblies include stamped and formed contacts having an insulative plastic molded over a central section of the contact. The molded inserts are receivable in the apertures of the substrate and are later swaged to retain them and the contacts to the substrate.

73 Claims, 39 Drawing Sheets

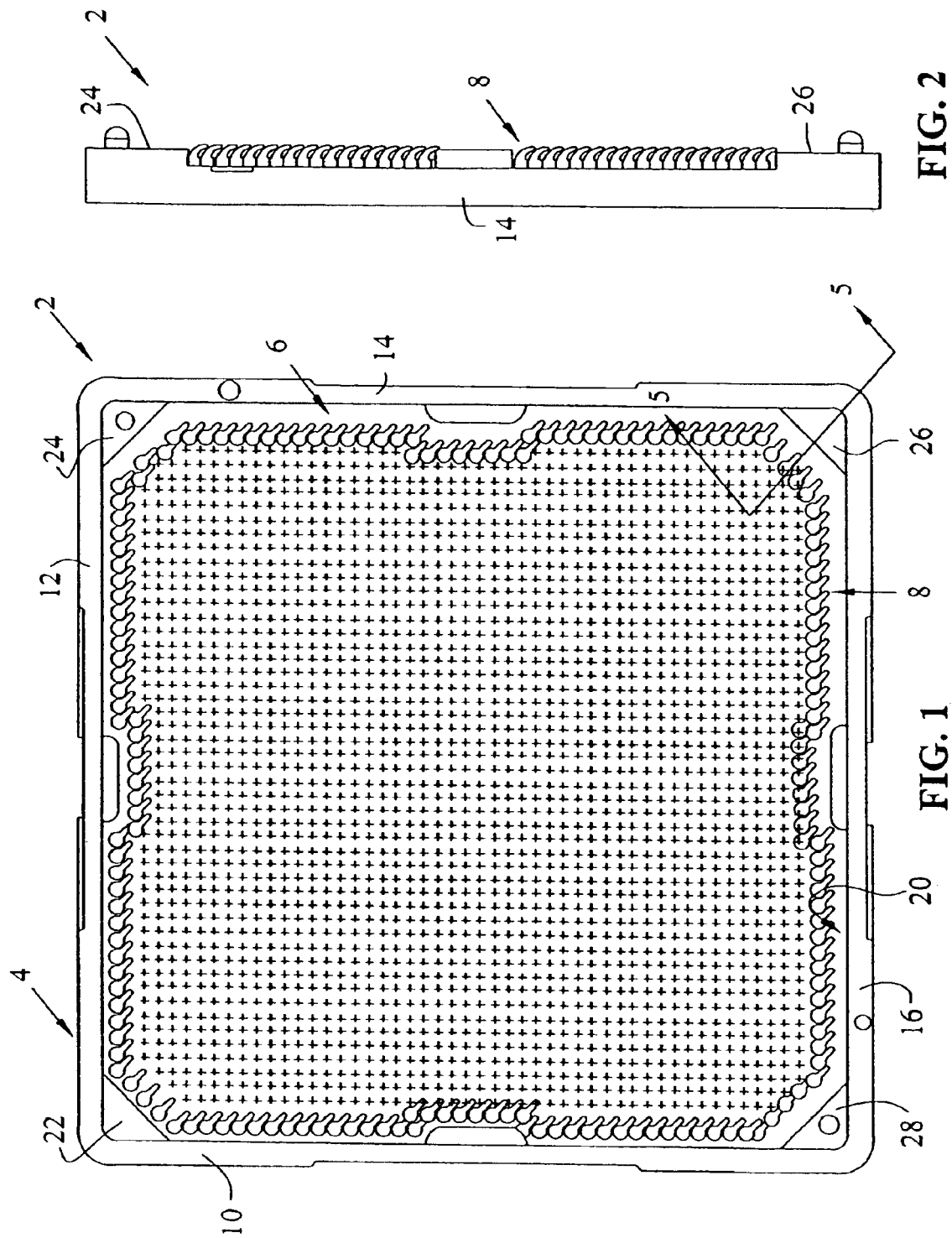

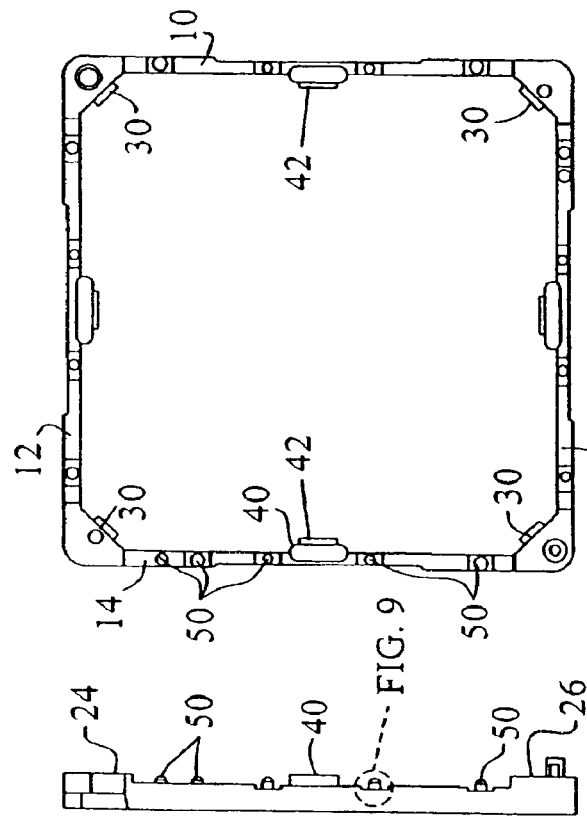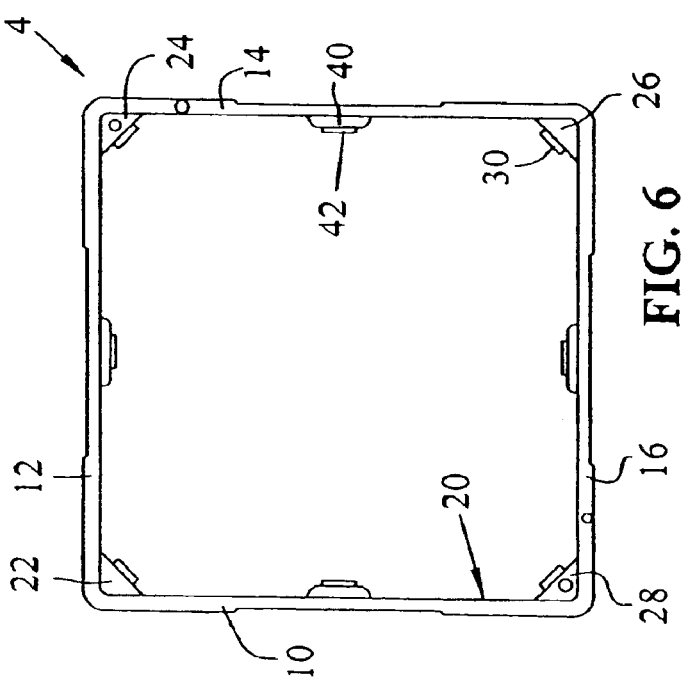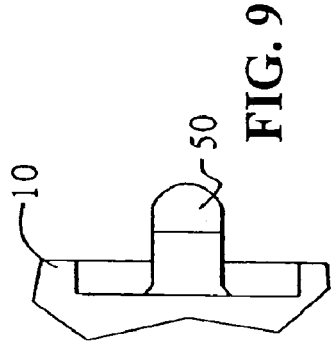

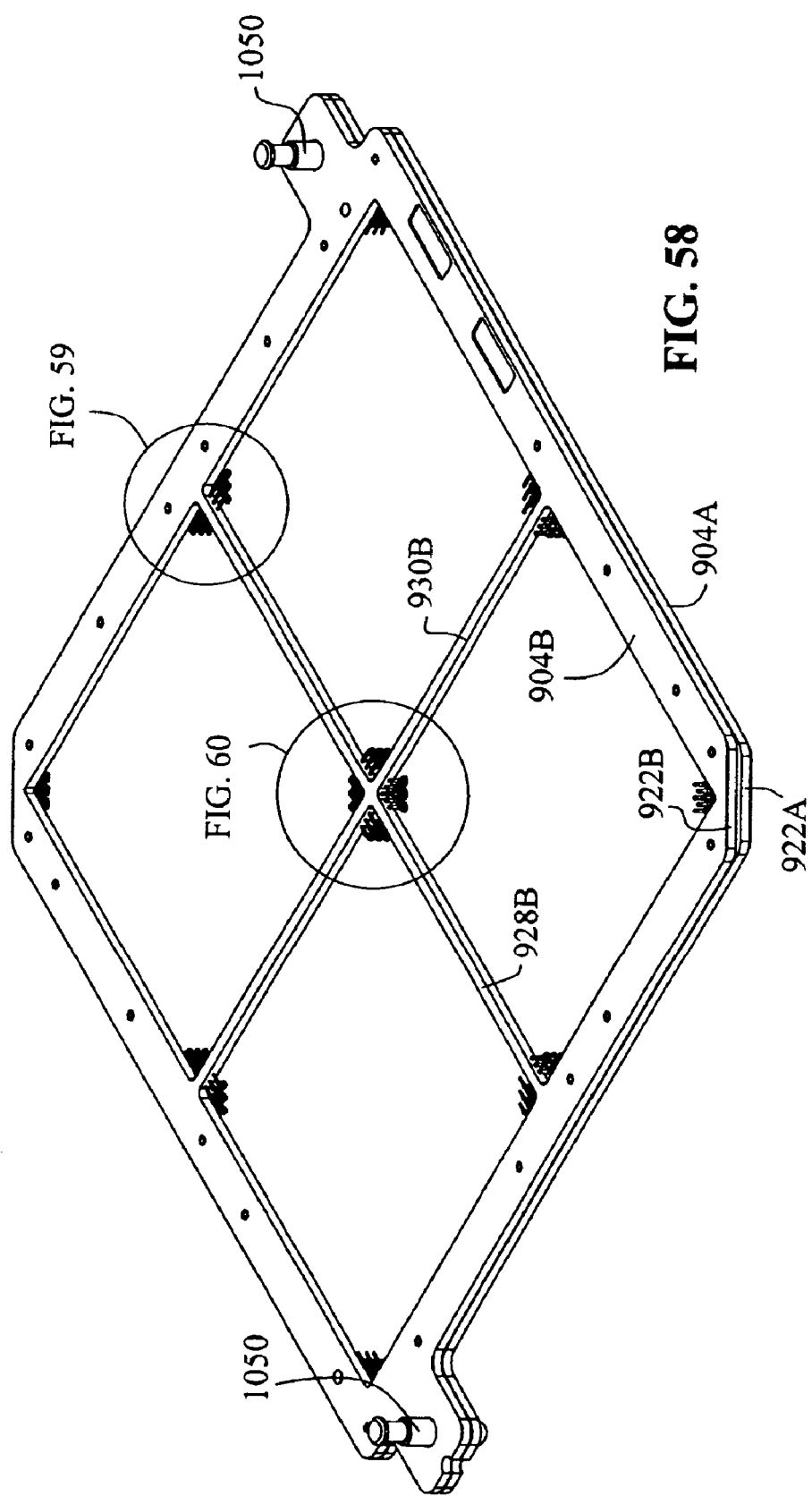

METAL CONTACT LGA SOCKET

This application claims the benefit of U.S. Provisional Patent Application Ser. No. 60/491,493 filed Jul. 31, 2003, the complete disclosure of which is hereby expressly incorporated by reference.

BACKGROUND OF THE INVENTION

The subject invention relates to a Land Grid Array (LGA) socket and a method of manufacturing the same.

Various packages or devices exist within the computer industry which require interconnection to a printed circuit board. These devices have lands or balls which are placed on 1.0-mm centerline spacing and below. These devices are profiled with arrays of 50 by 50 and even greater. Given the plurality of lands, their centerline spacing, and given the force applied to each land, this device causes a variety of problems in practice in connection to the printed circuit board.

Sockets exist within the market for the interconnection of such devices, where the sockets include columns of conductive polymer allowing the interconnection between the devices and the printed circuit boards. However, these devices too can cause some problems. For example, the conductive polymers can creep over time, and after temperature exposure and thermal cycling. Therefore, its elasticity is reduced, and the normal force, which is applied to the contact interface, is also reduced.

These and other problems are addressed by the present invention.

SUMMARY OF THE INVENTION

The objects have been accomplished by providing an LGA interconnect comprising a substrate and a plurality of contact assemblies, the substrate having a plurality of apertures therethrough arranged in an array, each contact assembly comprised of at least one metal contact and an insulative member. The insulative member is positioned in the aperture, positioning a first contact member of the metal contact above the substrate and a second contact of the metal contact below the substrate, the insulative member isolating the metal contact from the substrate.

The insulative member is attached to the metal contact. Preferably, the insulative member is overmolded on the metal contact. The substrate may be rigid, and may be made from metal.

The insulative member also retains the contact assembly to the substrate. The metal contact is comprised of an intermediate base portion with the printed circuit board contact and the chip contact extending from opposite ends thereof, with the insulative member being overmolded at the intermediate portion. The overmolded insulative member has a head portion larger than the aperture and a shank portion profiled to be received in the aperture. The overmolded insulative member is made of plastic material. The shank portion of the overmolded insulative member includes a slot profiled to be received in an edge of the substrate adjacent the apertures. The shank portion of the overmolded insulative member is swaged to retain the overmolded insulative member within the aperture.

The first and second contact members extend as cantilever beams from the insulative member. The LGA interconnect contact assemblies are arranged on the substrate with the cantilever beams oriented at an angle as measured about an axial centerline through the apertures, which is normal to the substrate. The angle is approximately 45 degrees. The LGA interconnect contact assemblies are arranged in at least two arrays with the cantilever beams extending opposed.

At least two arrays are aligned along at least one diagonal line across the substrate. The at least two arrays are aligned along plural diagonal lines. The LGA interconnect contact assemblies are arranged in quadrants, with all cantilever portions projecting generally towards a geometrical center of the substrate. Each insulative member comprises plural metal contacts positioned therein. The insulative member is overmolded around the contacts. The insulative member includes interstitial stops intermediate the contacts, to provide a stop member for contacts in another row. The LGA interconnect further comprises overstress stops positioned on the substrate to provide a stop position for the printed circuit board and the chip.

The substrate may be retained to the housing in a number of ways. The substrate may be retained by overmolding the housing around a periphery of the rigid substrate. In this manner, the housing is overmolded in sections. Alternatively, the housing may have a substrate-receiving surface with a plurality of extending pins, and the substrate has a like plurality of aligning apertures secured over the pins. The apertures include openings in a surrounding relationship to the apertures, defining resilient spring edges at the apertures.

The LGA interconnect further comprises stop members located along the housing to provide stop positions for the chip. The stop members can be integrally formed in the housing. Alternatively, the stop members are inserts having more rigidity than the material which forms the housing.

In another aspect of the invention, an LGA interconnect comprises a substrate having an upper surface and a lower surface and a plurality of apertures therethrough arranged in an array. The substrate has housing walls positioned around a periphery of the substrate, and upstanding at least from the upper surface, and a plurality of contact assemblies positioned in the plurality of apertures, each contact assembly comprised of at least one metal contact and an insulative member. The metal contact has a first contact portion projecting above the substrate upper surface, and a second contact portion projecting below the lower surface. The insulative member is positionable in the aperture, isolating the metal contact from the substrate.

Preferably, the insulative member is overmolded on the metal contact. The metal contact is comprised of an intermediate base portion with the printed circuit board contact and the chip contact extending from opposite ends thereof. The insulative member is overmolded at the intermediate portion. The overmolded insulative member has a head portion larger than the aperture and a shank portion profiled to be received in the aperture. The overmolded insulative member is made of plastic material. The shank portion of the overmolded insulative member is swaged to retain the overmolded insulative member within the aperture.

In this aspect of the invention, the substrate may be retained to the housing in a number of ways. The substrate may be retained by overmolding the housing around a periphery of the rigid substrate. In this manner, the housing is overmolded in sections. Alternatively, the housing may have a substrate-receiving surface with a plurality of extending pins, and the substrate has a like plurality of aligning apertures secured over the pins. The apertures include openings in a surrounding relationship to the apertures, defining resilient spring edges at the apertures.

The plurality of contact assemblies can be aligned in an opposed manner, along a diagonal line across the substrate.

The plurality of contact assemblies can also be aligned along plural diagonal lines. The printed circuit board contacts and chip contacts extend towards each other along the diagonal line. Each insulative member comprises plural metal contacts positioned therein, and the insulative member is overmolded around the contacts. The insulative member includes interstitial stops intermediate the contacts, to provide a stop member for contacts in another row. The LGA interconnect further comprises overstress stops positioned on the substrate to provide a stop position for the printed circuit board and the chip.

The LGA interconnect further comprises stop members located along the housing to provide stop positions for the chip. The stop members can be integrally formed in the housing. Alternatively, the stop members are inserts having more rigidity than the material which forms the housing.

In an inventive method, the method of making an array of contacts for interconnecting a chip component to a printed circuit board, comprising the steps of forming a substrate to define a perimeter edge and an array of apertures therethrough; forming a plurality of metal contacts to each include an intermediate portion, an upper contact portion extending from an upper portion of the intermediate portion and a lower contact portion extending downwardly from the intermediate portion; positioning the intermediate portions of the metal contacts through the apertures; and electrically isolating the metal contacts from the rigid substrate.

The metal contacts are isolated from the rigid substrate by molding an insulative insert over the intermediate portion. The overmolded insert is molded to include a head portion, which is larger than the apertures, and a shank portion, which is receivable in the apertures. The apertures are provided by an etching process. The overmolded inserts are held in place in the substrate by swaging the shank portions to enlarge at least a portion of the shank portions to a dimension larger than the aperture. The method further comprises the step of providing a housing in a surrounding relation to the rigid substrate, to surround the upper contact portions, and to define a chip-receiving nest. The housing is provided by overmolding the housing to the rigid substrate.

BRIEF DESCRIPTION OF THE DRAWINGS

FIG. 1 is a top plan view of the LGA interconnect of the present invention;

FIG. 2 is an end view of the LGA interconnect shown in FIG. 1;

FIG. 6 is a top plan view of the socket housing of FIG. 1;

FIG. 7 is an end view of the socket housing of FIG. 6;

FIG. 8 is a lower plan view of the socket housing of FIGS. 6 and 7;

FIG. 9 is an enlarged view of the portion denoted in FIG. 7;

FIG. 58 is a view similar to that of FIG. 57 from the opposite side thereof;

DETAILED DESCRIPTION OF THE PREFERRED EMBODIMENT

Figure 5:
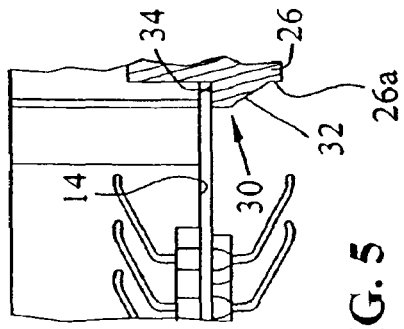
FIG. 5 is a cross-sectional view through lines 5—5 of FIG. 1.
Figure 4:
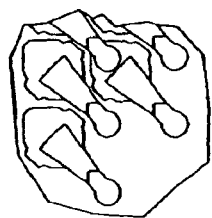
FIG. 4 is an enlarged view of the section denoted in FIG. 3.

The subject invention relates to a Land Grid Array (LGA) interconnect socket and a method of manufacturing the same. When used herein, the term LGA is meant to define many different interconnects. For example, it could be interpreted to mean a chip interconnected to a printed circuit board. However, it can also mean a board to board interconnect. In this application, the invention will be described by way of an interconnect to a chip.

With reference first to FIG. 1, LGA interconnect 2 is shown as including an insulative housing 4, which retains and aligns a substrate 6 attached thereto, where substrate 6 holds a plurality of contact assemblies 8 in a fixed array as shown. It should be appreciated from FIG. 1 that housing 4 includes a plurality of perimetral walls 10, 12, 14, and 16, all of which define an inner chip-receiving nest, generally designated herein as reference numeral 20. It should be further understood that housing 4 includes corner standoffs or feet 22–28, where the standoffs and the contact assemblies 8 are defined such that a portion of the contact assemblies 8 extends lower than a plane defined by feet 24, 26, as shown in FIG. 2, so as to contact respective pads on a printed circuit board. With the general nature of the socket as described above, the detail of the individual components and their assembly will now be described in greater detail.

With respect first to FIG. 6, housing 4 is shown without substrate 6. It should be understood that the four side walls 10–16 include respective corner standoffs 22–28. As also shown in FIG. 6, each of the corner standoffs includes a latch member 30, which is best shown in FIG. 5. The latch has a ramped surface 32 and a top shoulder as shown at 34. In addition to the corner standoffs 22–28, each of the side walls includes a standoff 40 which, as shown in FIG. 7, coincides in a planar manner with standoffs 24, 26. That is, all of the corner standoffs and all of the intermediate standoffs are profiled to coincide in the same plane in order to support the housing flat on a planar surface, such as a printed circuit board. Intermediate standoff 40 also includes a latch member 42 having a latching member substantially identical to latch member 30 (FIG. 5), which will be described in further detail herein. Finally, as shown in FIGS. 7–9, each of the side walls 10–16 includes a plurality of aligning lugs 50, which are shown in greater detail in FIG. 9. Identical lugs are positioned along a lower edge of side walls 12, 14 and 16. It should be noted, however, that walls 10 and 16 have a dissimilar array of lugs 50 for polarizing purposes, as will also be described further herein.

Figure 11:
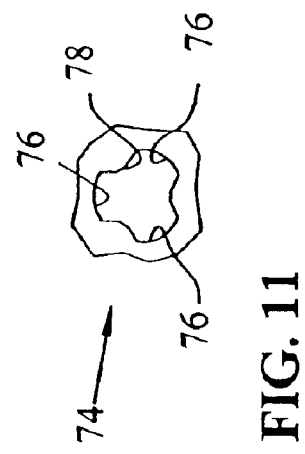
FIG. 11 is an enlarged portion of the section denoted in FIG. 10.
Figure 10:
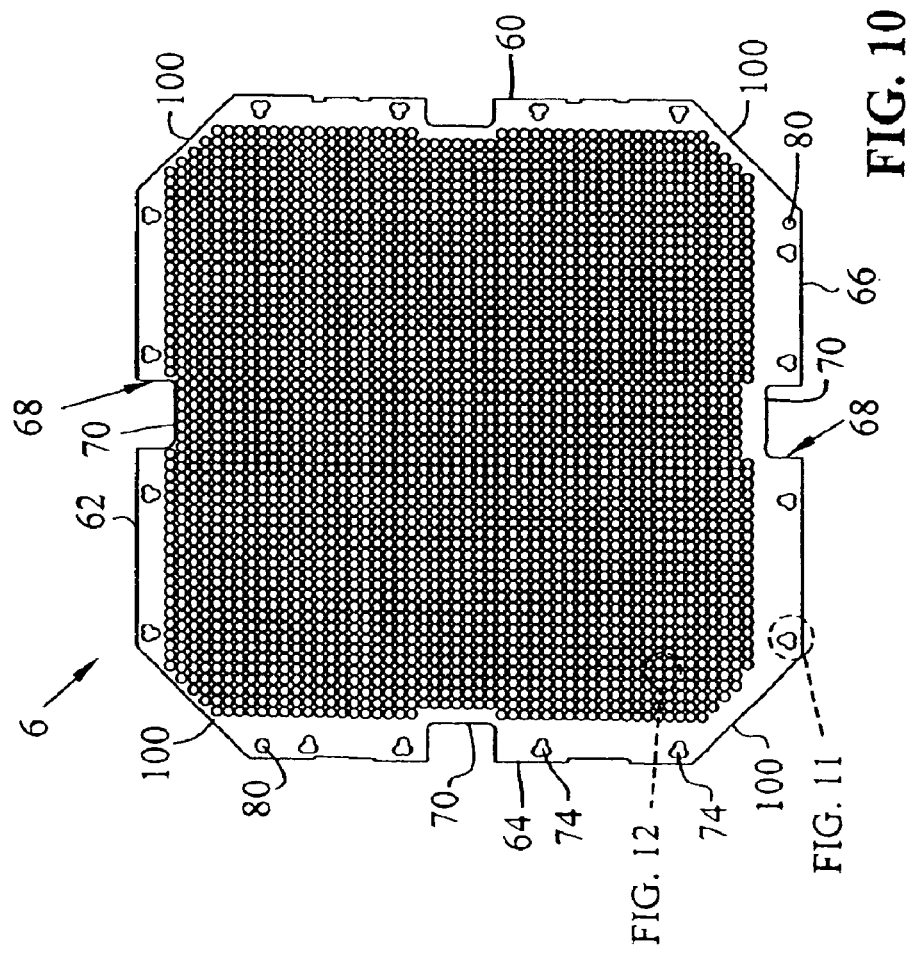
FIG. 10 is an upper plan view of the contact carrying substrate of the present invention.

With reference now to FIG. 10, substrate 6 is shown in greater detail. As shown, substrate 6 generally includes side edge 60, which is profiled to lie over wall 10; side edge 62, to lie over wall 12; side edge 64, to lie over wall 14; and side edge 66, to lie over wall 16. It should also be noted that each of the side edges 60–66 includes a cut-out aperture at 68 having a latching edge at 70. Substrate 6 further includes a plurality of alignment holes 74, which are shown in greater detail in FIG. 11. The alignment holes have a generally arcuate configuration defined by arcuate sections 76, with circular projections defined in three places, for example, at 78, for aligning with pins 50. It should also be appreciated that polarizing apertures 80 are shown to polarize substrate 6 with the housing 4.

Figure 12:
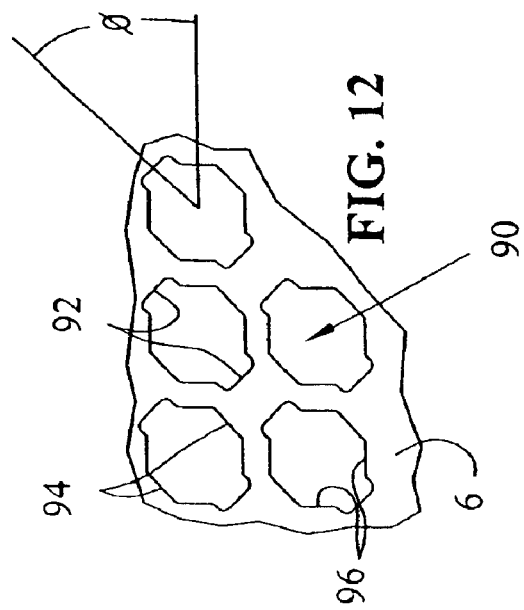
FIG. 12 shows an enlarged version of the section denoted in FIG. 10.

As shown in FIG. 12, substrate 6 includes an array of apertures shown generally at 90 having slotted end walls at 92, side walls at 94, and diagonal wall portions 96 intermediate thereto. As shown best in FIG. 12, each aperture is positioned in the substrate at an angle Φ as measured about the axial centerline through the aperture. It should be understood that this axis is normal to the paper as viewed in FIG. 12. As shown in the embodiment of FIG. 12, Φ=45°. Finally, as shown best in FIG. 10, each corner of the substrate 6 includes a diagonal edge portion shown at 100.

Figure 14:
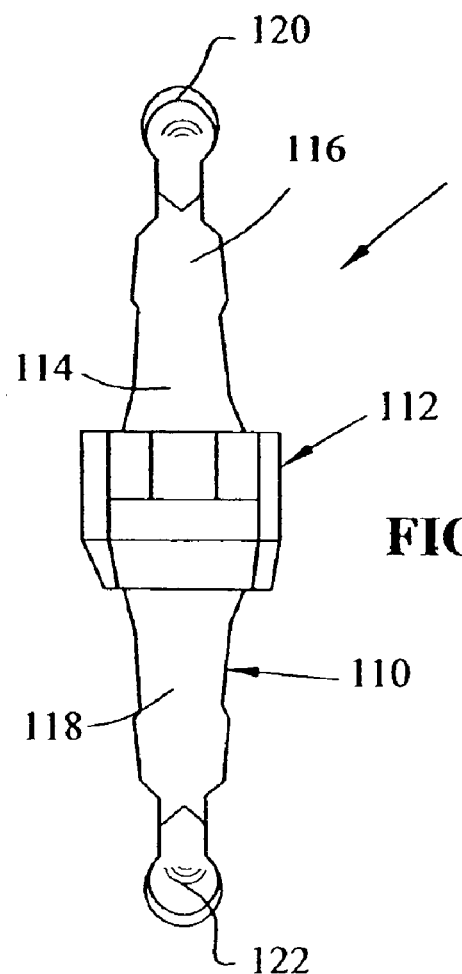
FIG. 14 shows a front plan view of the contact assembly shown in FIG. 13.
Figure 13:
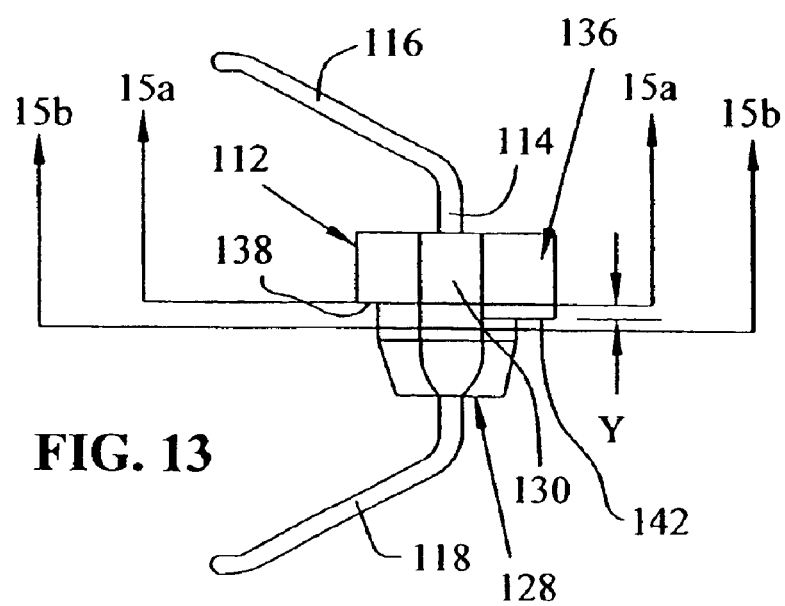
FIG. 13 is a side view of the contact assembly of the present invention.

With reference now to FIGS. 13–15, contact assembly 8 will be described in greater detail. As shown in FIGS. 13 and 14, contact assembly 8 includes a conductive contact member 110 and an overmolded portion 112. Contact portion 110 includes an intermediate portion 114, an upper chip contacting portion 116, and a lower printed circuit board contact section 118. Each of the contact portions 116 and 118 extend from intermediate section 114 at approximately 30° angle from horizontal, and include a spherically shaped contact section 120, 122, with the convex surface facing outwardly.

Figure 15A:
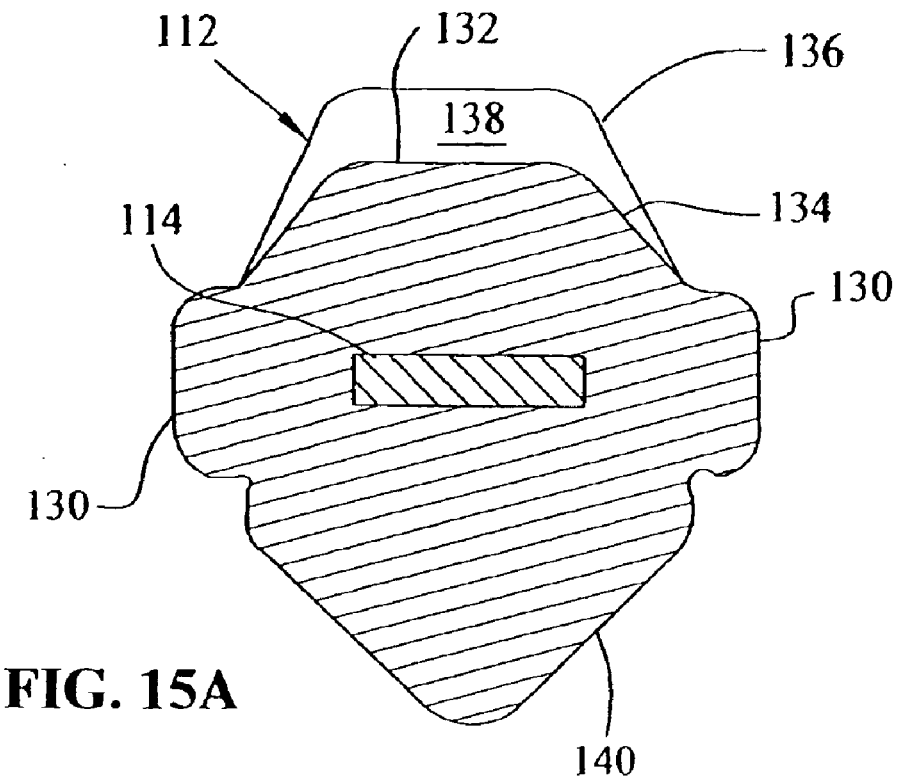
FIG. 15A shows a cross-sectional view through lines 15A—15A of FIG. 13.
Figure 15B:
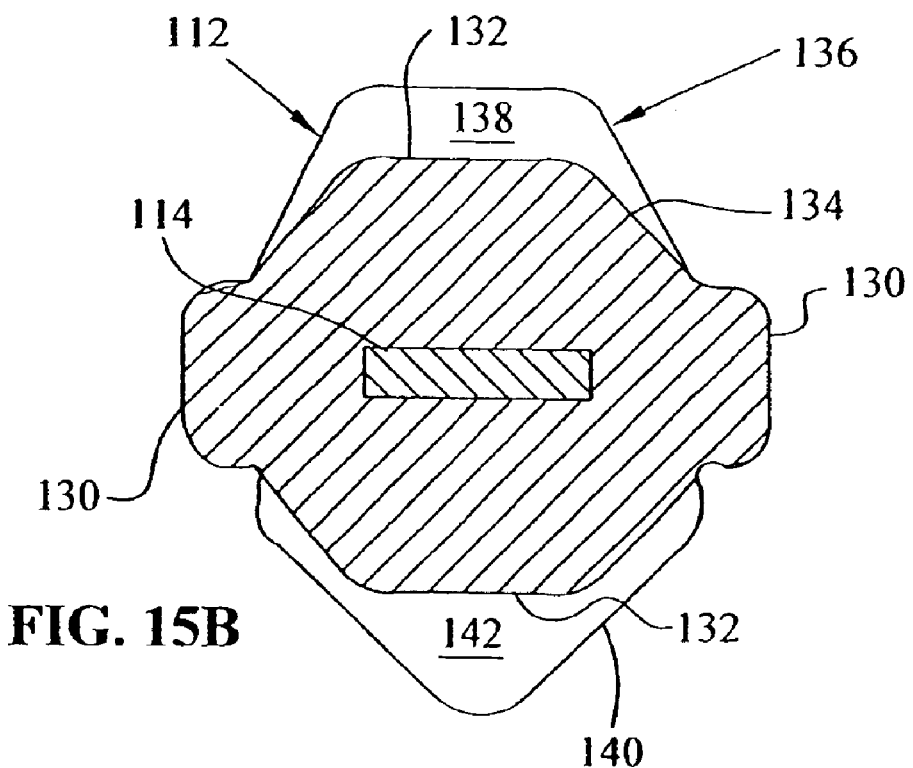
FIG. 15B shows a cross-sectional view through lines 15B—15B of FIG. 13.

With respect now to FIGS. 13, 15A and 15B, the molded insert 112 will be described in greater detail. As shown, the insert 112 has a shank portion 128 generally profiled for receipt in apertures 90. The insert has end walls 130 profiled to be received within slotted walls 92; side walls 132 profiled to be received between edges 94 (FIG. 12); and diagonal walls 134 profiled to be received within edges 96

(FIG. 12). As shown in FIG. 13, molded insert also includes molded head portion 136, which is enlarged relative to the lower shank portion 128.

As shown in FIG. 13, head portion 136 has two surfaces 142 and 138, where surface 142 is vertically offset (lower as viewed in FIG. 13) from surface 138 by a dimension "Y," where Y=0.038 mm. This defines two surfaces as best viewed in FIG. 15B, an enlarged surface 142, and surface 138, which is slightly raised relative to surface 142. The purpose for this vertical offset will be described herein.

With the above-mentioned components as described, the method of manufacturing the components can now be described. With respect first to FIG. 16, a strip of material 150 is shown, which can be used to produce substrates 6. In a preferred embodiment of the invention, the substrates 6 are produced from stainless steel in order to define a rigid substrate. However, other materials could be used as alternatives, such as ceramics, plastics, or other sufficiently rigid materials.

Figure 16:
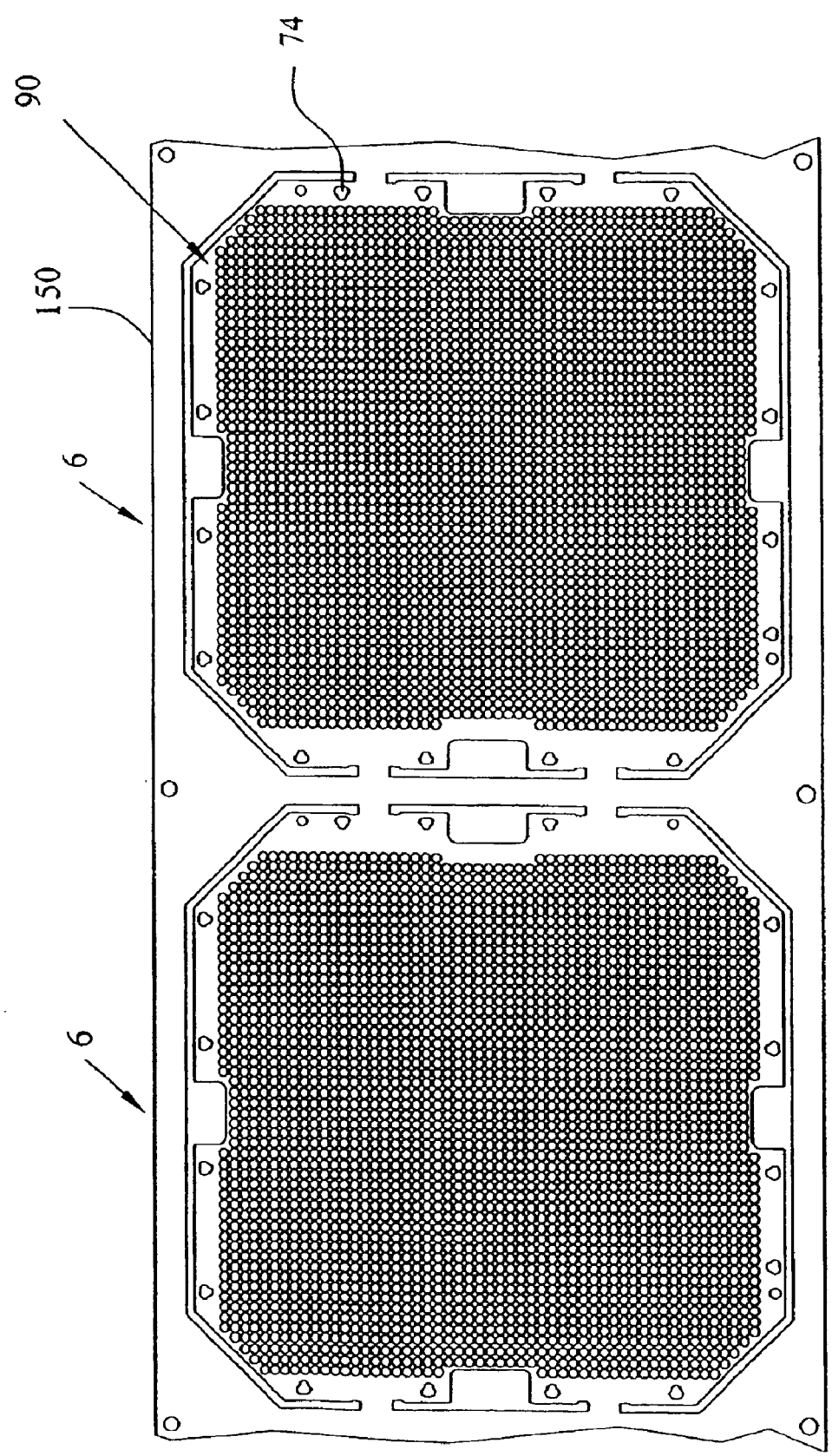
FIG. 16 is a progressive view showing the substrate shown in FIG. 10 in a partially etched configuration.

As shown in FIG. 16, the majority of the detail of the edges, the apertures 90, and the alignment openings 74 can be produced by an etching process, which provides dimensions having extremely tight tolerances. It should be appreciated that, with the etched substrates 6 as shown in FIG. 16, the strip of material 150 can be further processed whereby the contacts can be loaded, and the substrates stamped free from their carrier strip 150. The etching process can also produce a flat strip of material, not subject to the forces of the stamping process. It should also be understood that an etching process could be used to remove the individual substrates 6 from respective strips 150.

Figure 17:
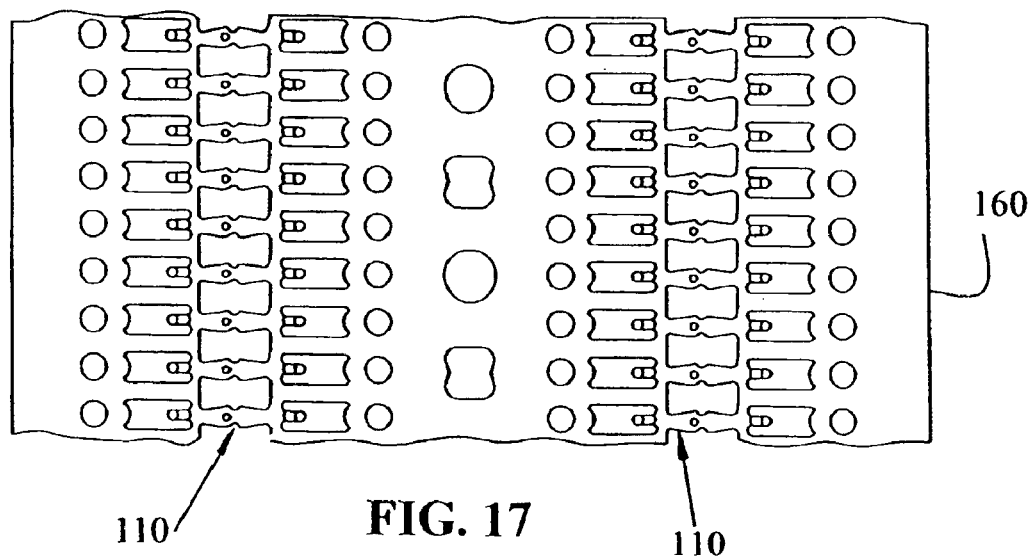
FIG. 17 shows a progressive strip of terminal stampings showing the contacts prior to overmolding of the insulative inserts.
Figure 18:
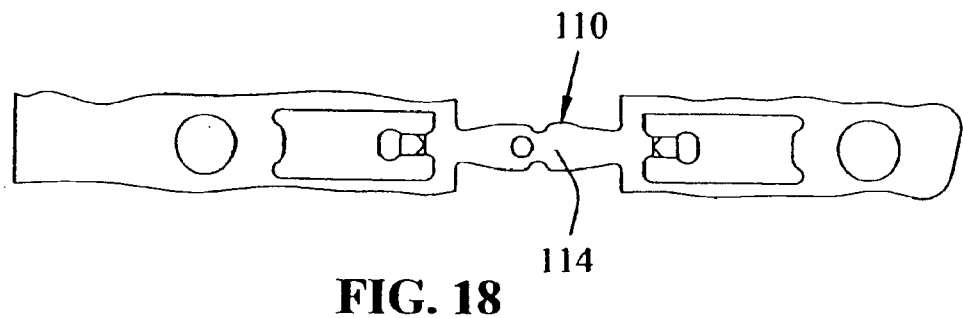
FIG. 18 is an enlarged one of the progressive stampings.
Figure 19:
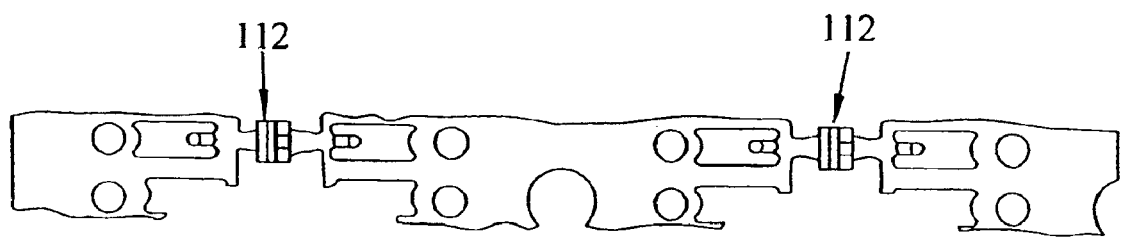
FIG. 19 is a view similar to that of FIG. 20 showing the insulative inserts overmolded over a central portion of the contacts.

With reference now to FIG. 17, a carrier strip of terminals is shown in a preprocess form, where a plurality of terminals 110 are defined by a progressive stamping process. As shown, the carrier strip 160 includes side-by-side strips of contacts, where the intermediate portions 114 of the terminals are open, as best shown in FIG. 18. Thus, as shown in FIG. 19, the molded inserts 112 can be overmolded over the intermediate portions 114, while the terminals are still in a carrier-strip form and then later stamped free to define the final contact assembly 8. In the embodiment described, the plastic is a polyester PBT, 30% glass filed, known as VALOX 420, however, other plastics could be used which achieve the functionality herein described.

Figure 21:
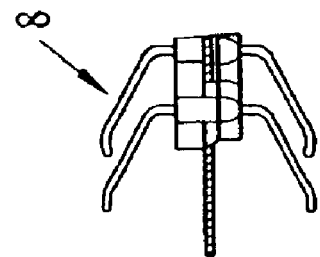
FIG. 21 is a cross-sectional view through lines 21—21 of FIG. 20.
Figure 20:
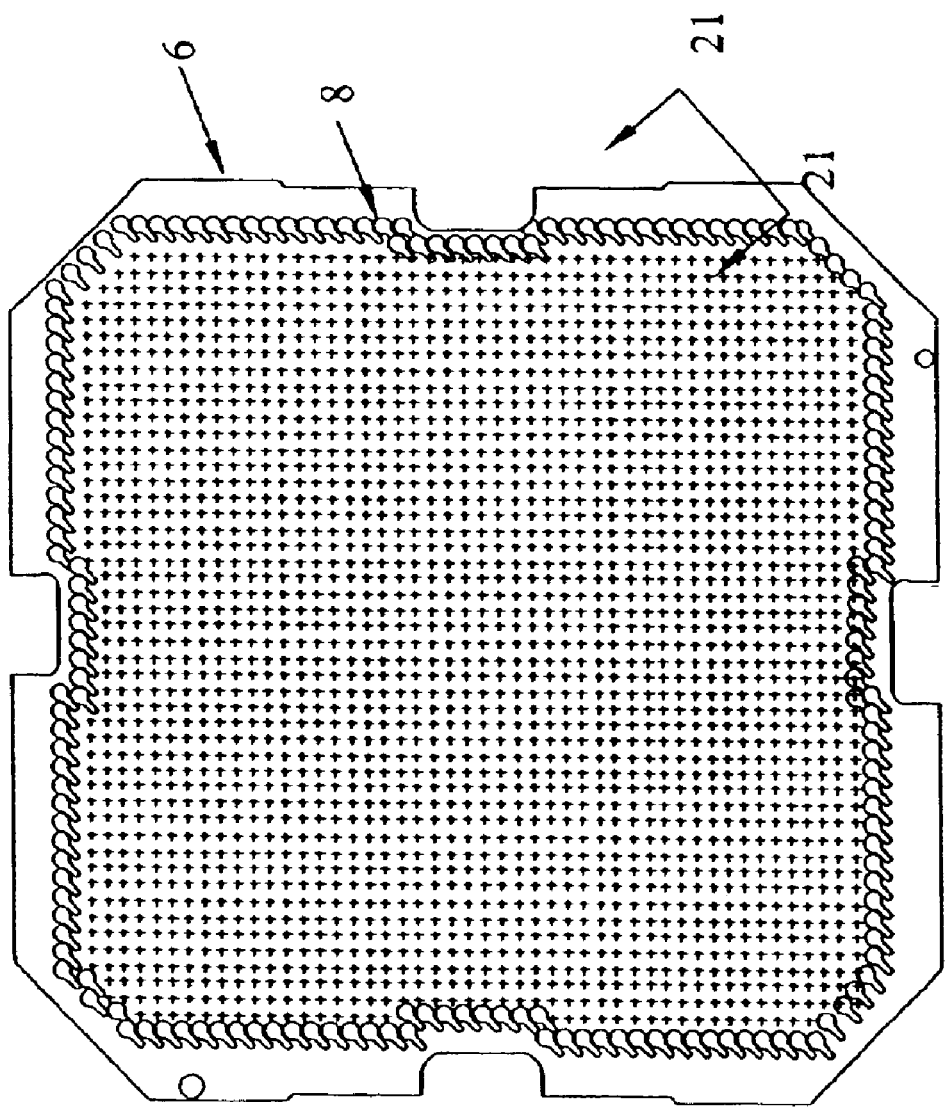
FIG. 20 shows the substrate with the array of inserts loaded within the substrate apertures.
Figure 23:
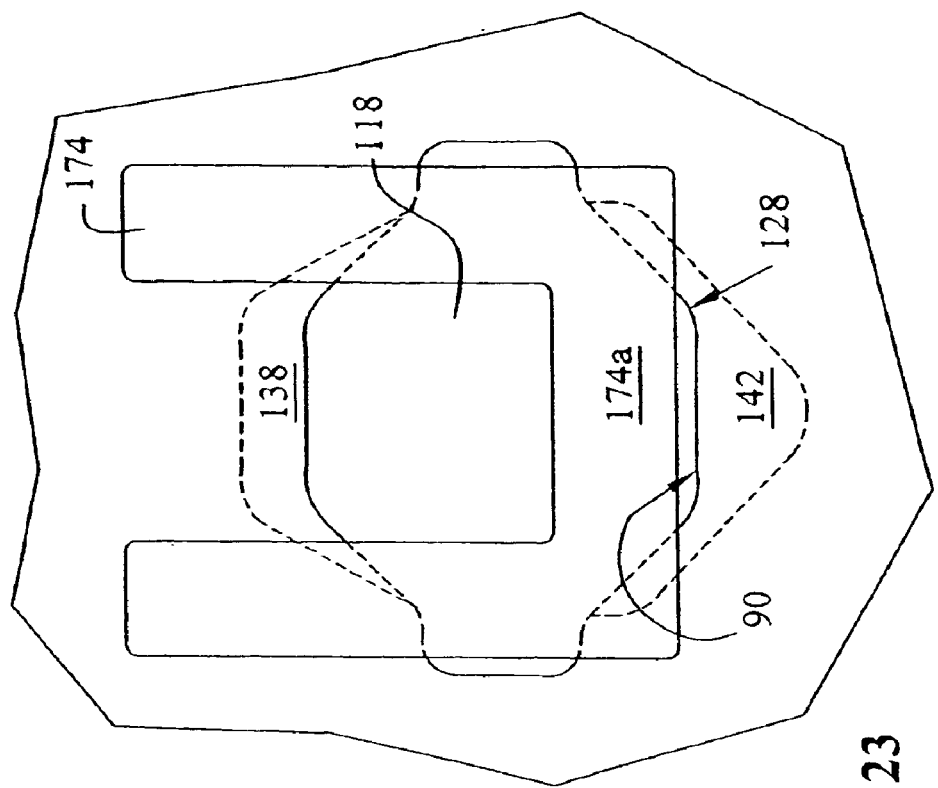
FIG. 23 shows a view of the plastic insert protruding through the aperture, with the lower swaging die in place.
Figure 22:
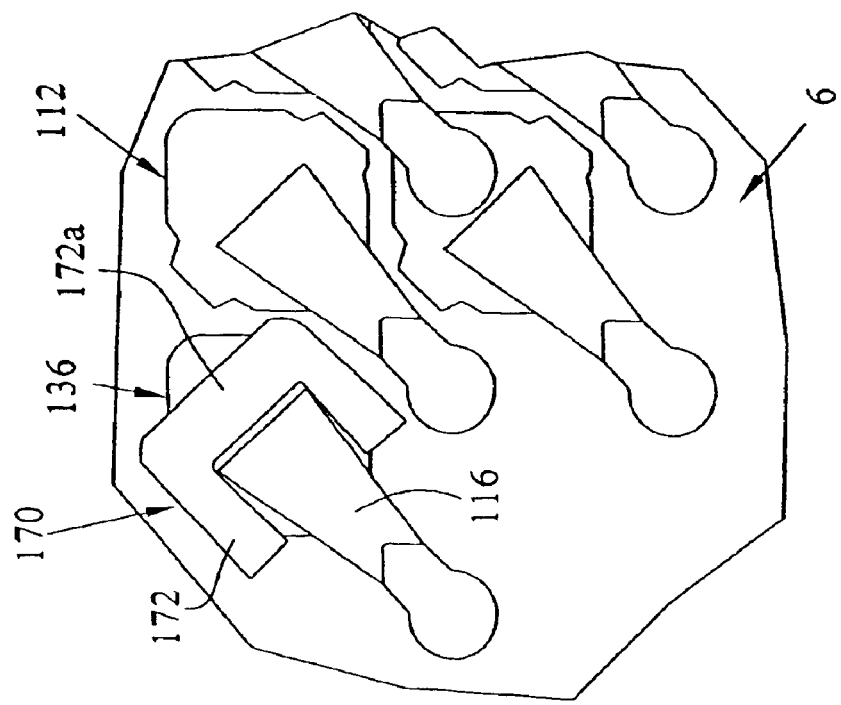
FIG. 22 shows a view similar to FIG. 4 showing the upper swaging die in place.
Figure 24:
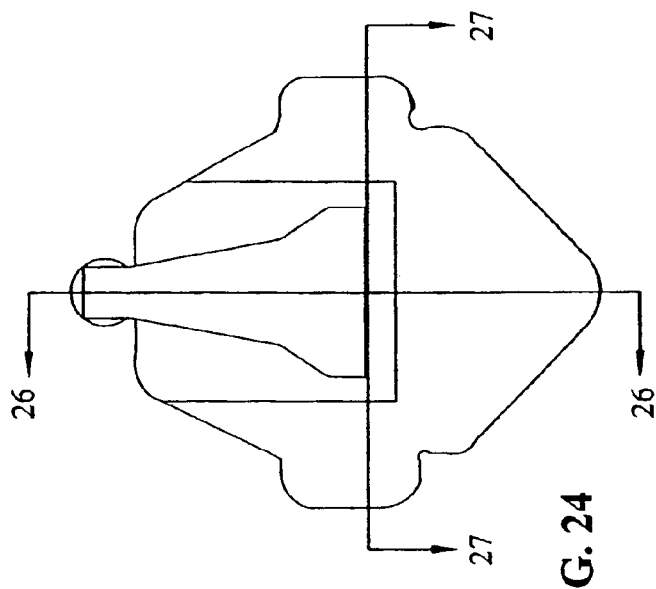
FIG. 24 shows a detailed view of the top of the contact assembly after cold forming.
Figure 26:
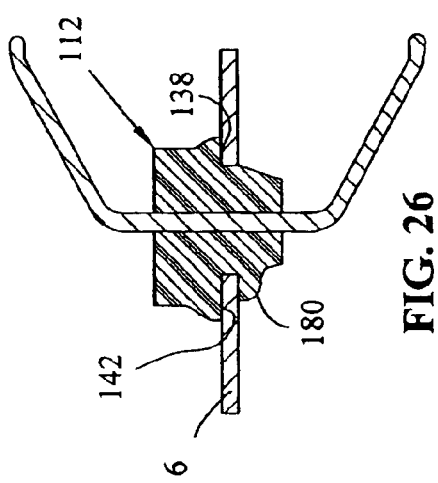
FIG. 26 shows a cross-sectional view through lines 26—26 of FIG. 24.
Figure 25:
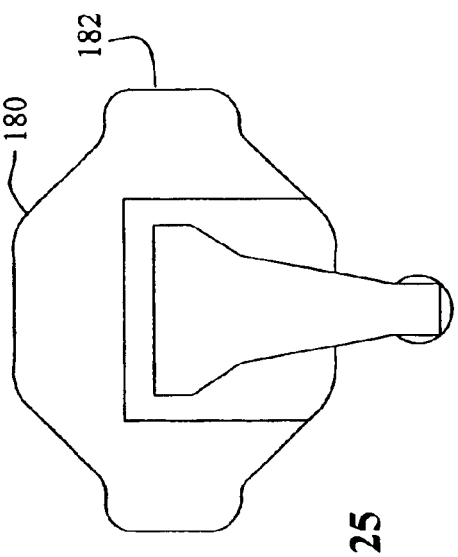
FIG. 25 shows a detailed view of the bottom of the contact assembly after cold forming.
Figure 27:
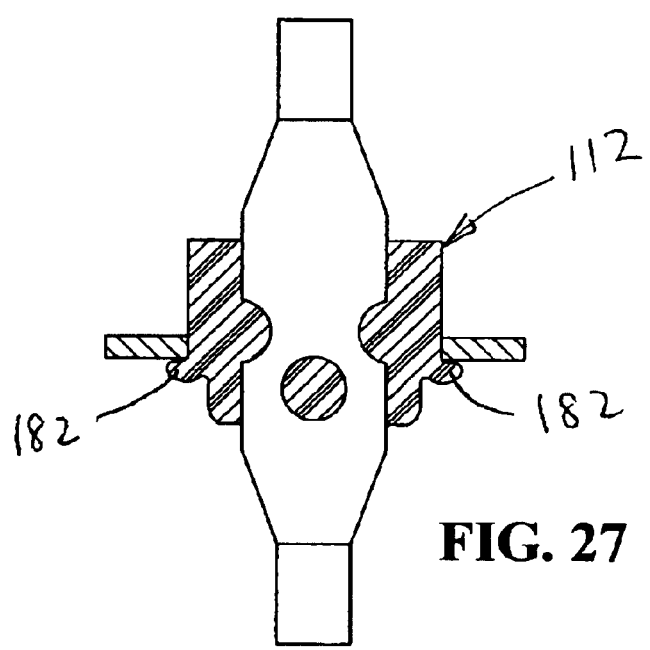
FIG. 27 shows a cross-sectional view through lines 27—27 of FIG. 24.

As shown in FIGS. 20 and 21, the contact assemblies 8 are now loaded within their respective apertures 90, such that shoulder surface 142 abuts substrate 6. At this point in time, the shank portion 128 of the molded insert 112 is simply resting in the aperture, supported by only surface 142 on substrate 6. As mentioned above, this places a small gap between surface 138 and the substrate 6. As shown now in FIG. 22, a U-shaped die assembly 170 is utilized to cold form, or "swage" the plastic insert into a rivet-like connection within the substrate 6. The die assembly 170 has an upper die 172 (FIG. 22) and a lower die 174 (FIG. 23). As shown in FIG. 22, the upper die 172 is positioned around the upper contact portion 116 and against the head portion 136 of plastic insert 112. As shown in FIG. 23, the shank portion 128 of insert 112 is shown protruding through aperture 90, where die portion 174 is positioned directly above the shank portion.

It should be appreciated that the base portions 172a and 174a are positioned over the position where surface 142 resides, that is, the surface which abuts the substrate 6. Thus, when the two dies are moved in a swaging fashion towards each other, the swaging action causes vertical movement of the insert. The fact that surface 142 is raised, and is flush against substrate 6 (and due to the gap Y), the force against the insert in opposite directions prevents a moment about the insert, and a twisting of the insert or contact, which would tend to dislocate or disorient the contact assembly.

With respect now to FIGS. 24–27, the post cold forming insert will be described. As shown best in FIGS. 25 and 26, insert includes a cold formed swaged portion 180 on the opposite side of the substrate from surface 142. As shown best in FIG. 26, the force on insert 112 causes surface 142 and surface 138 to be planar against the substrate 6. In other words, surface 142 is crushed somewhat to overcome the dimension Y. With respect now to FIG. 27, the swaging of dies 170 causes the lower surfaces of sections 130 to be cold formed under as shown at 182. These cold forms 180, 182 retain each individual contact assembly 8, firmly in place.

Figure 3:
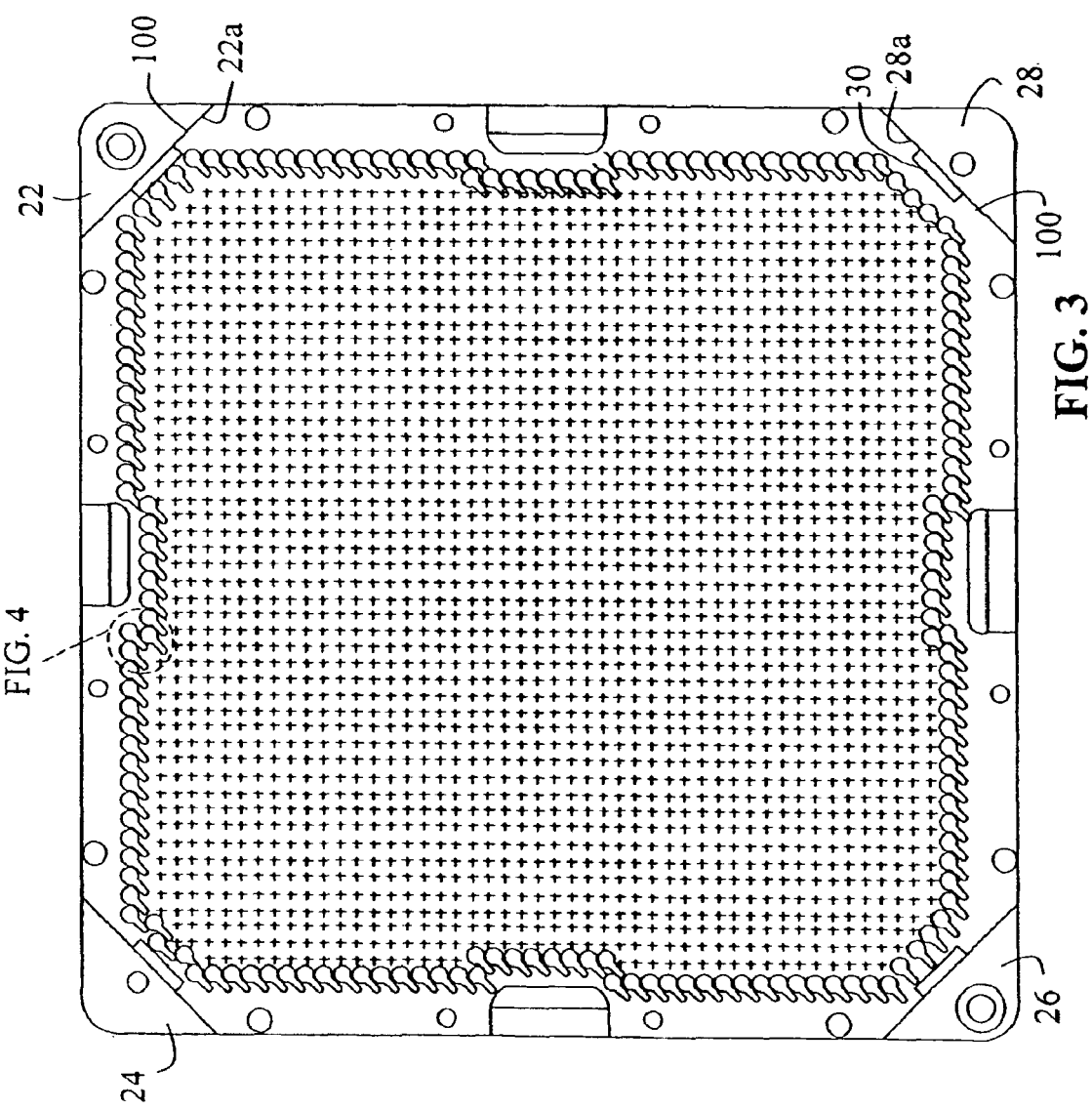
FIG. 3 is a lower plan view of the LGA interconnect of FIG. 1.

With the substrate completed as mentioned above, the substrate can now be snapped in place into the housing, as shown in FIG. 3. It should be appreciated that the substrate diagonal edges 100 fit adjacent to edge 26A (FIG. 5) and then snap over latch member 30 to abut lower edge of wall 14, as shown in FIG. 5. It should be appreciated that edges 70 (FIG. 10) are snapped over latches 42 (FIG. 6) to latchably hold the substrate to the housing. This provides the LGA interconnect 2 shown in FIGS. 1 and 3.

The embodiment shown above has many advantages not shown by prior art designs. The plastic molded insert not only acts as a retention feature, but also as an insulator from the substrate 6. Meanwhile, the use of the stainless steel substrate acts like a floating midplane, enabling true load equalization between nonplanar surfaces. Furthermore, the substrate concept acts as a built-in strain relief, which can flex away from any frictional forces, and thereby reduce forces which would normally be absorbed by locating latching features on the board/socket.

Figure 28:
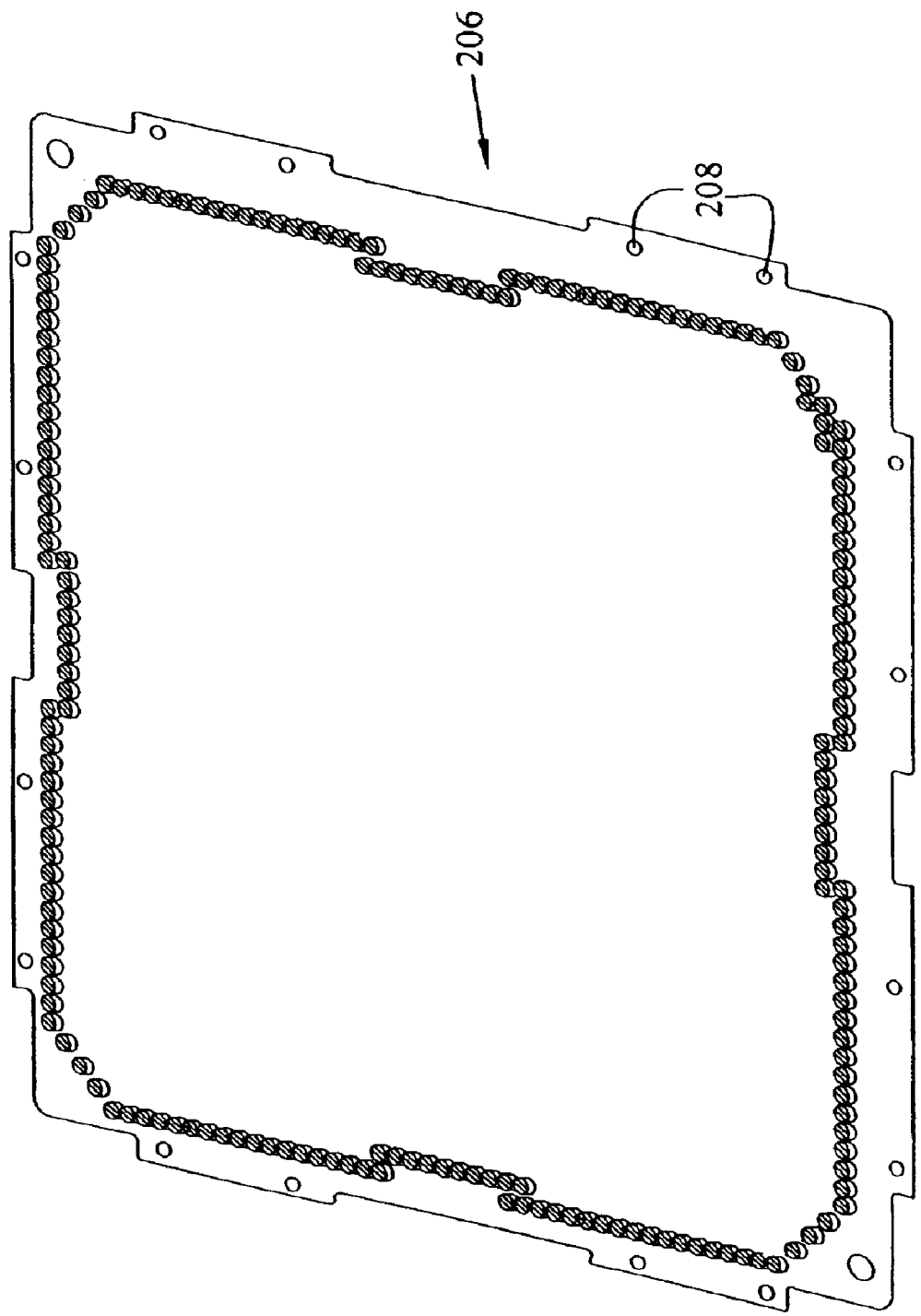
FIG. 28 shows an alternate embodiment substrate, where the substrate is profiled for overmolding the housing directly to the substrate.
Figure 29:
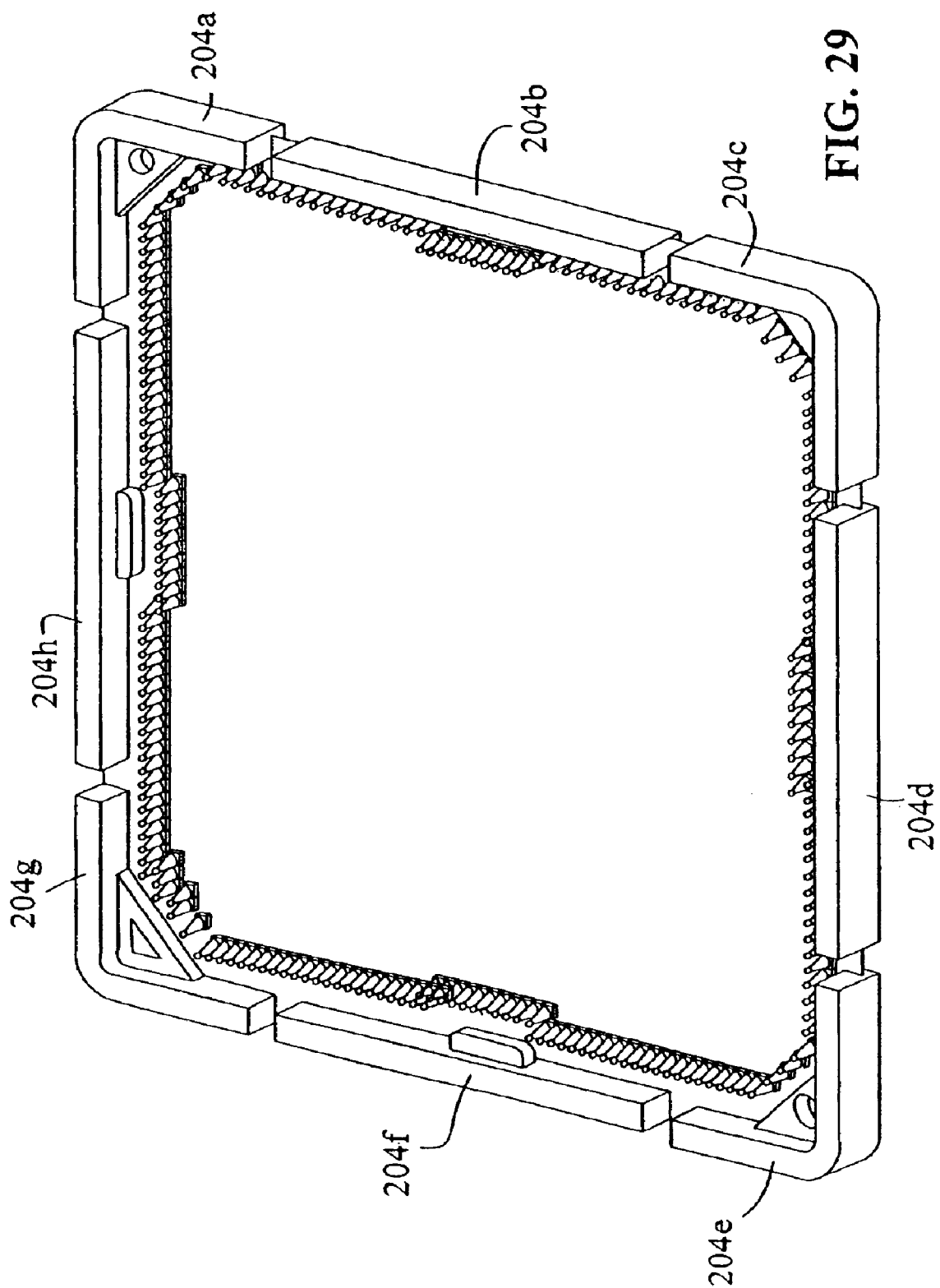
FIG. 29 shows the housing integrally molded directly to the substrate.

As an alternative to latching the substrate 6 to housing 4, as shown in FIGS. 28 and 29, an alternate substrate 206 is shown having a plurality of apertures 208 around the periphery of substrate 206, whereby housing portions 204A–204H can be molded to the periphery of substrate 206, where the plastic of the sections encapsulates apertures 208 around the periphery. This provides precise location of the surfaces of housing portions 204A–204H relative to the substrate 206.

Figure 31:
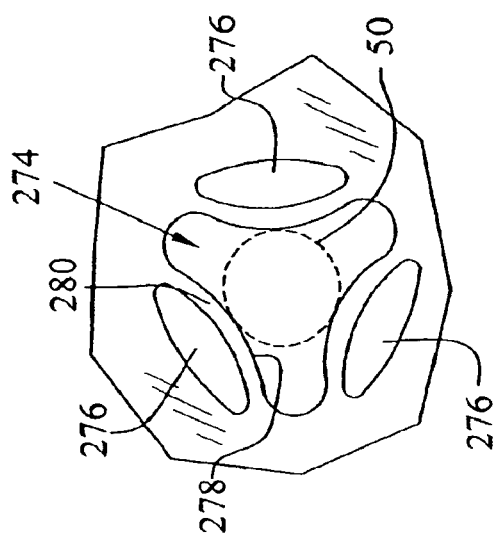
FIG. 31 shows the detail denoted in FIG. 30 showing an alternate alignment and retention aperture.
Figure 30:
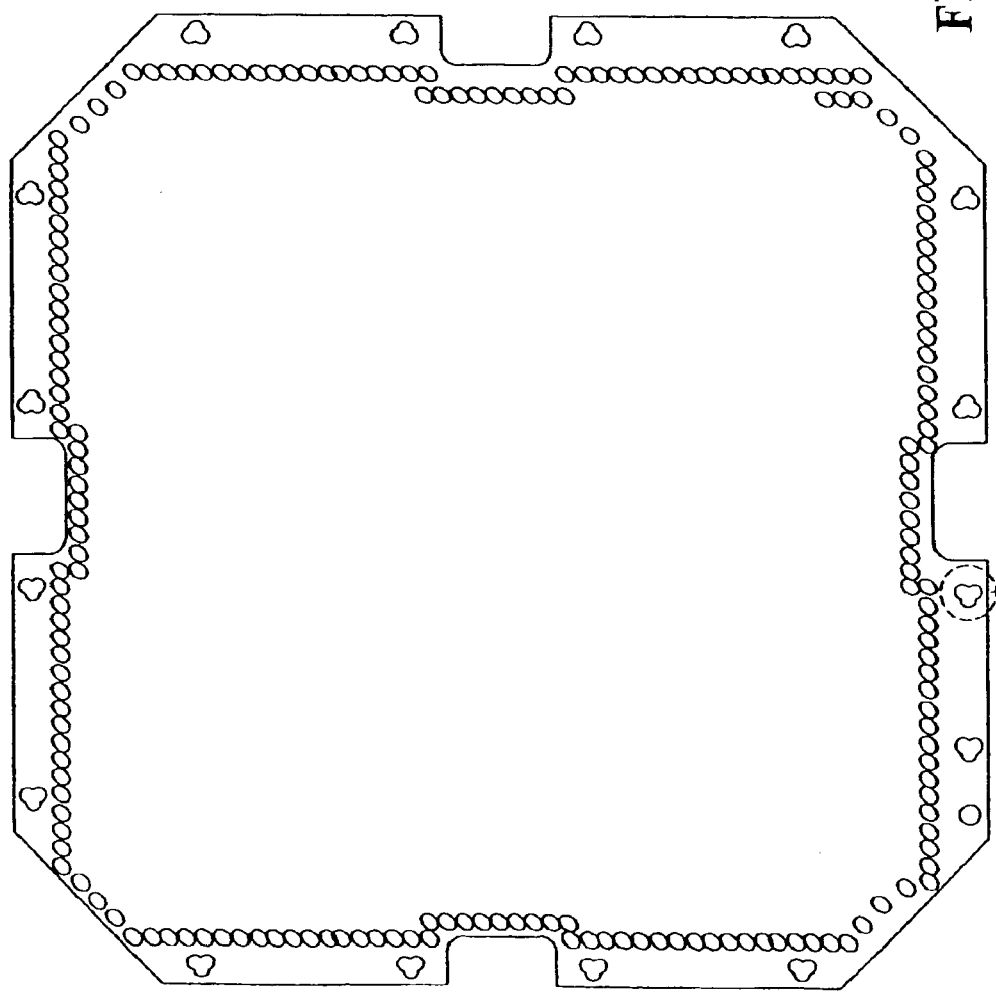
FIG. 30 shows yet another embodiment of the substrate.

As a further alternative, as shown in FIGS. 30 and 31, apertures 274, while similarly configured to apertures 74 (FIG. 11), can include elongate openings 276, such that contact portions 278 are defined on spring beams 280 deflectable to receive pin 50 in a centered but floatable manner.

Figure 32:
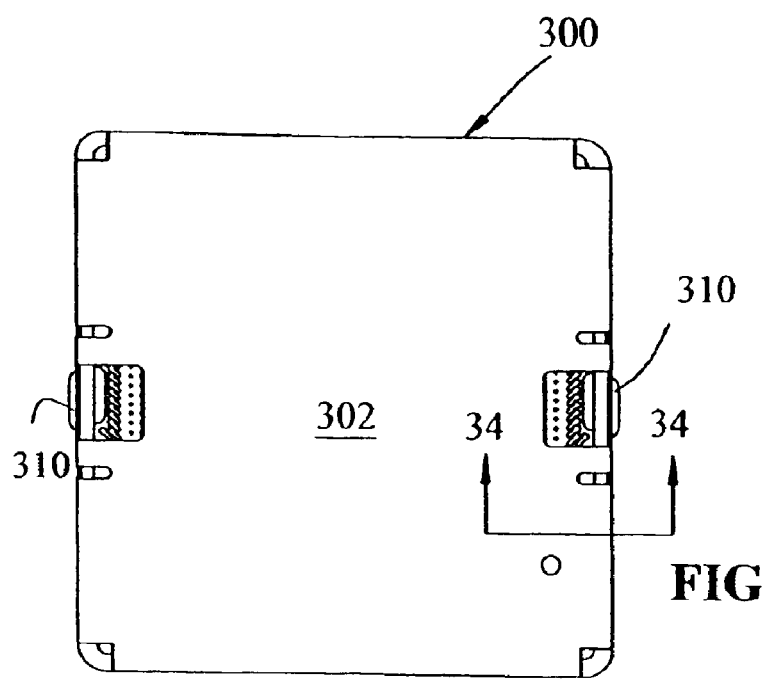
FIG. 32 shows a top plan view of the socket of FIG. 1 with an optional pick-and-place cover attached thereto.
Figure 33:
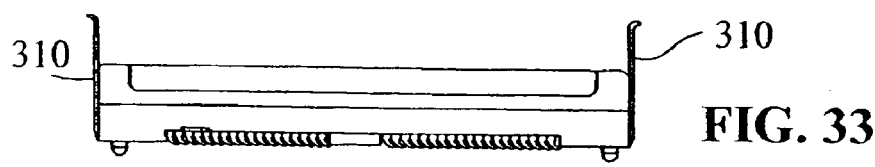
FIG. 33 is a side plan view of the assembly shown in FIG. 32.
Figure 34:
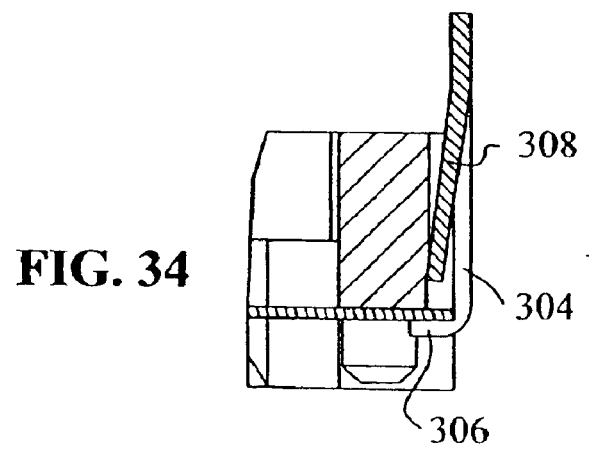
FIG. 34 is a cross-sectional view through lines 34—34 of FIG. 32.

Finally, with respect to FIGS. 32–34, a pick-and-place cover 300 can be used with a socket, as described above. The cover includes an enlarged top portion 302 to define a flat gripping surface, side walls 304 which surround the socket, and lower edges 304 having fingers 306 extending beneath the socket, whereby a latch arm 308 engages a shoulder on the housing, as shown in FIG. 28. Latch arms 310 are used to remove the cover.

Figure 35:
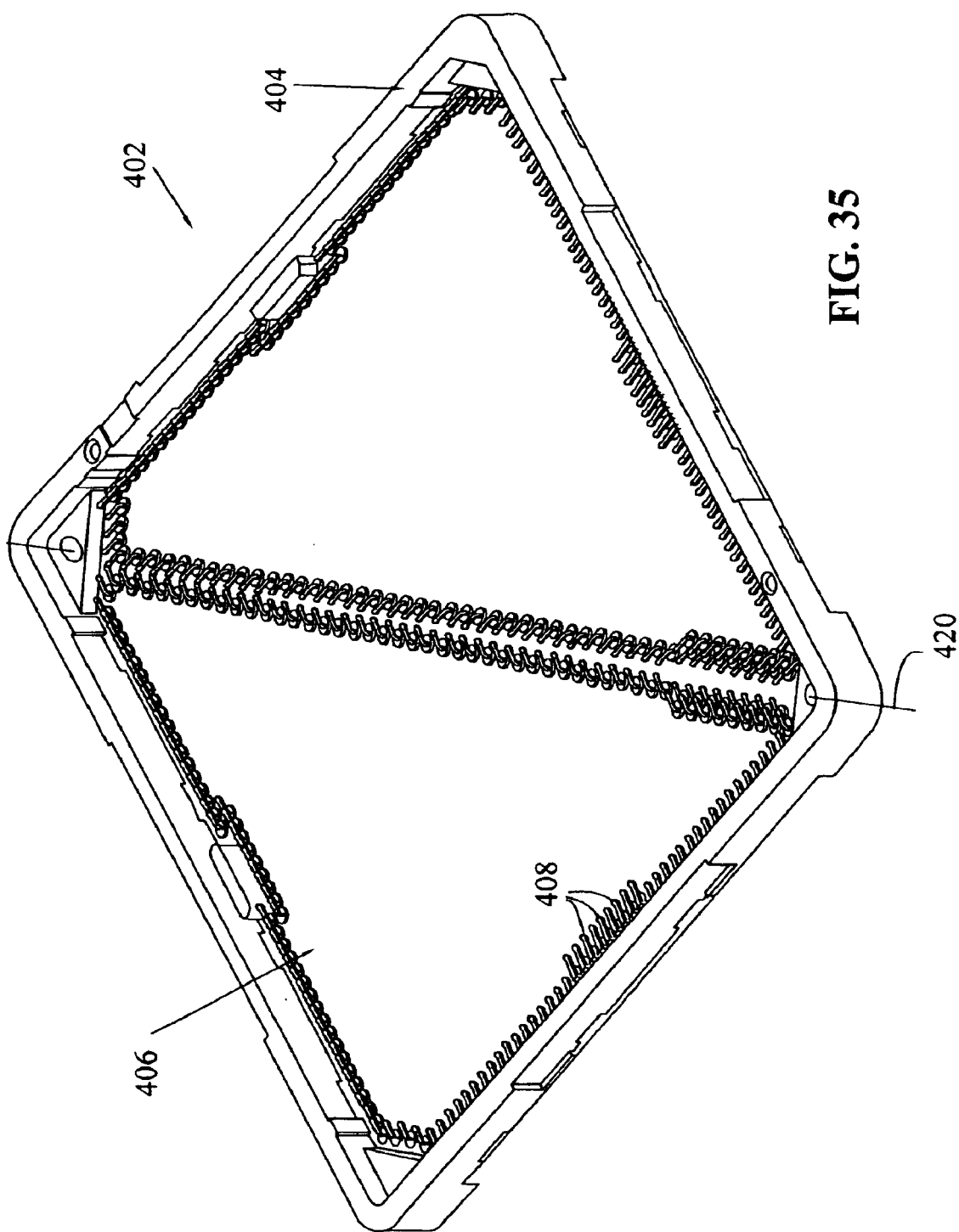
FIG. 35 shows an embodiment of a connector having the contacts arranged in two sets of opposed contacts, aligned along a central diagonal.
Figure 36:
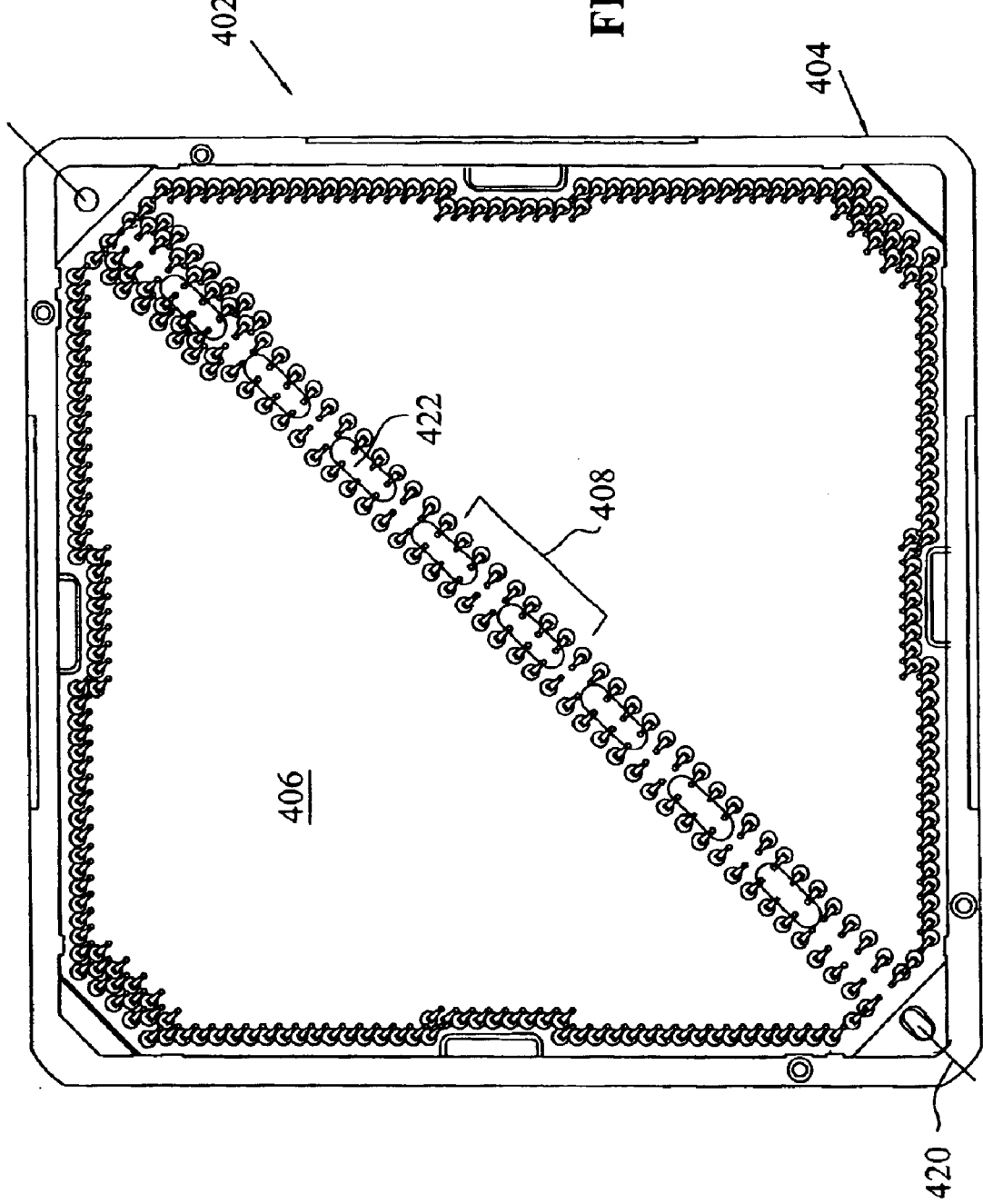
FIG. 36 shows a top plan view of the device of FIG. 35.
Figure 37:
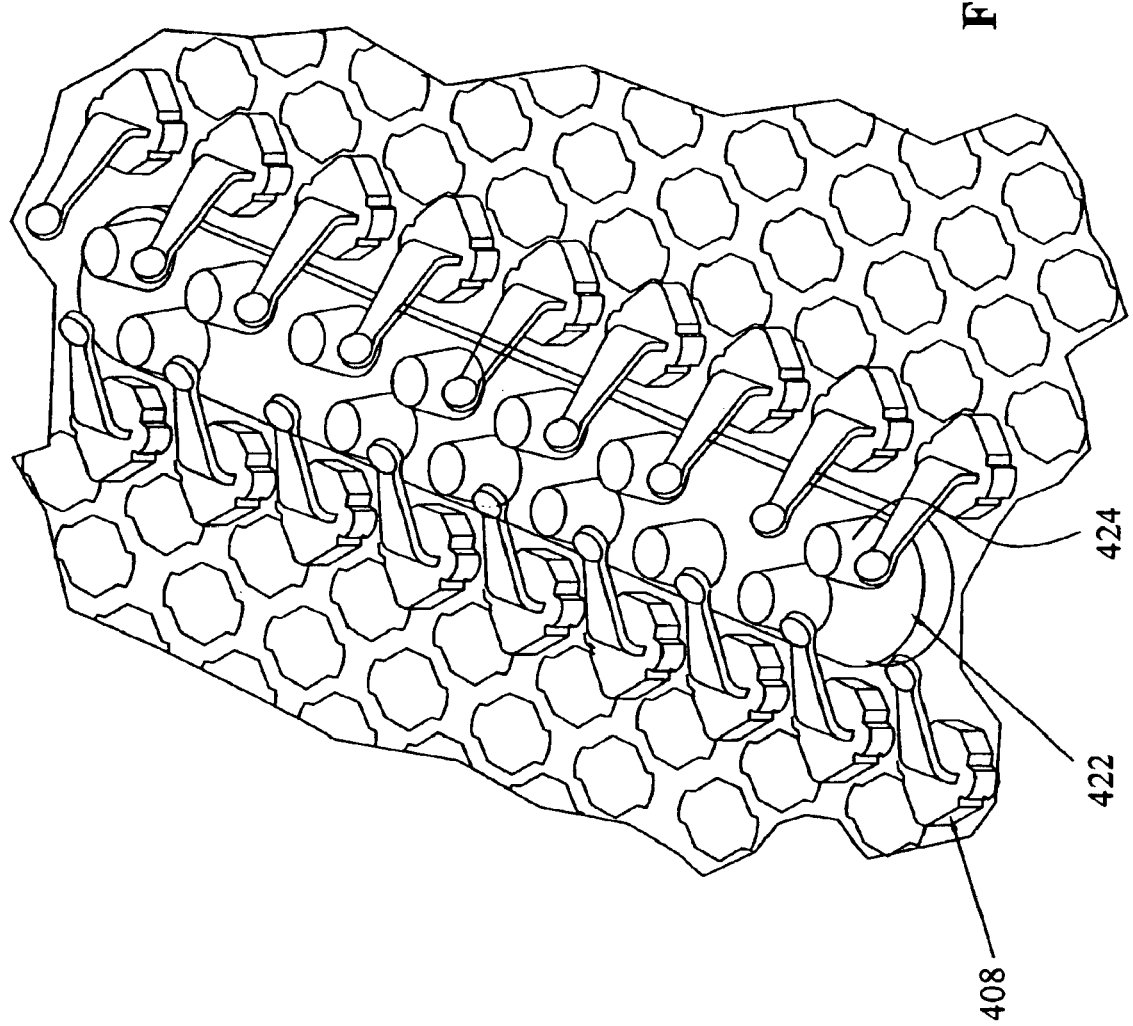
FIG. 37 shows center overstress stops positioned on the substrate along the diagonal.

With respect now to FIGS. 35–37, an embodiment of LGA interconnect according to the above-mentioned principles is shown, where the socket is designed for a large plurality of contact positions. For example, as shown in FIG. 35, the LGA interconnect is designed for a high density array, for example, 2,500+ positions.

This connector is shown generally at 402 including a housing 404, a substrate 406, and a plurality of contact assemblies 408. As should be appreciated, due to the wiping action of the contacts upon insertion of the chip, and upon positioning of the socket to a printed circuit board, large lateral forces are exerted on the substrate and housing. Thus, in this embodiment, the contact assemblies 408 are positioned in opposing manner along a diagonal 420. In this manner, the lateral forces, which are transferred through the housing, are canceled due to the opposing nature of the forces on the contact assemblies.

As shown in FIGS. 36 and 37, a stop member 422 can be integrally molded along the diagonal 420 with a plurality of upstanding pylons 424 being positioned intermediate the contacts so as to define a maximum insertion position of the chip, and thereby preventing overstressing of the contact members.

Figure 38:
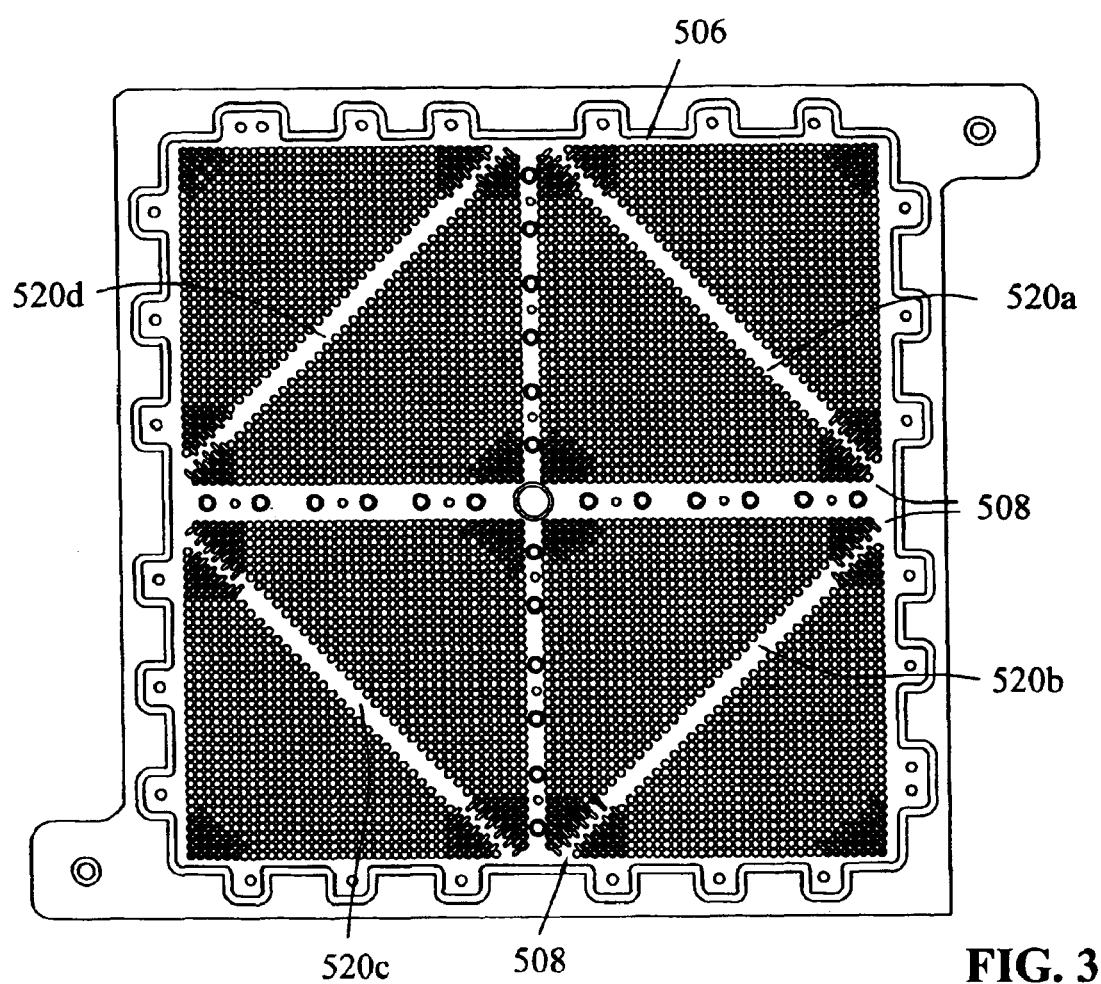
FIG. 38 shows a socket similar to that of FIG. 35 having the contacts arranged in plural sets of opposed contacts along multiple diagonals.

With respect now to FIG. 38, a substrate 506 is shown for an even larger array, that is, for 5,100+ positions, where substrate 506 positions contact assemblies 508 in an opposed manner along four diagonals, 520a, 520b, 520c, and 520d.

Figures 39, 40:
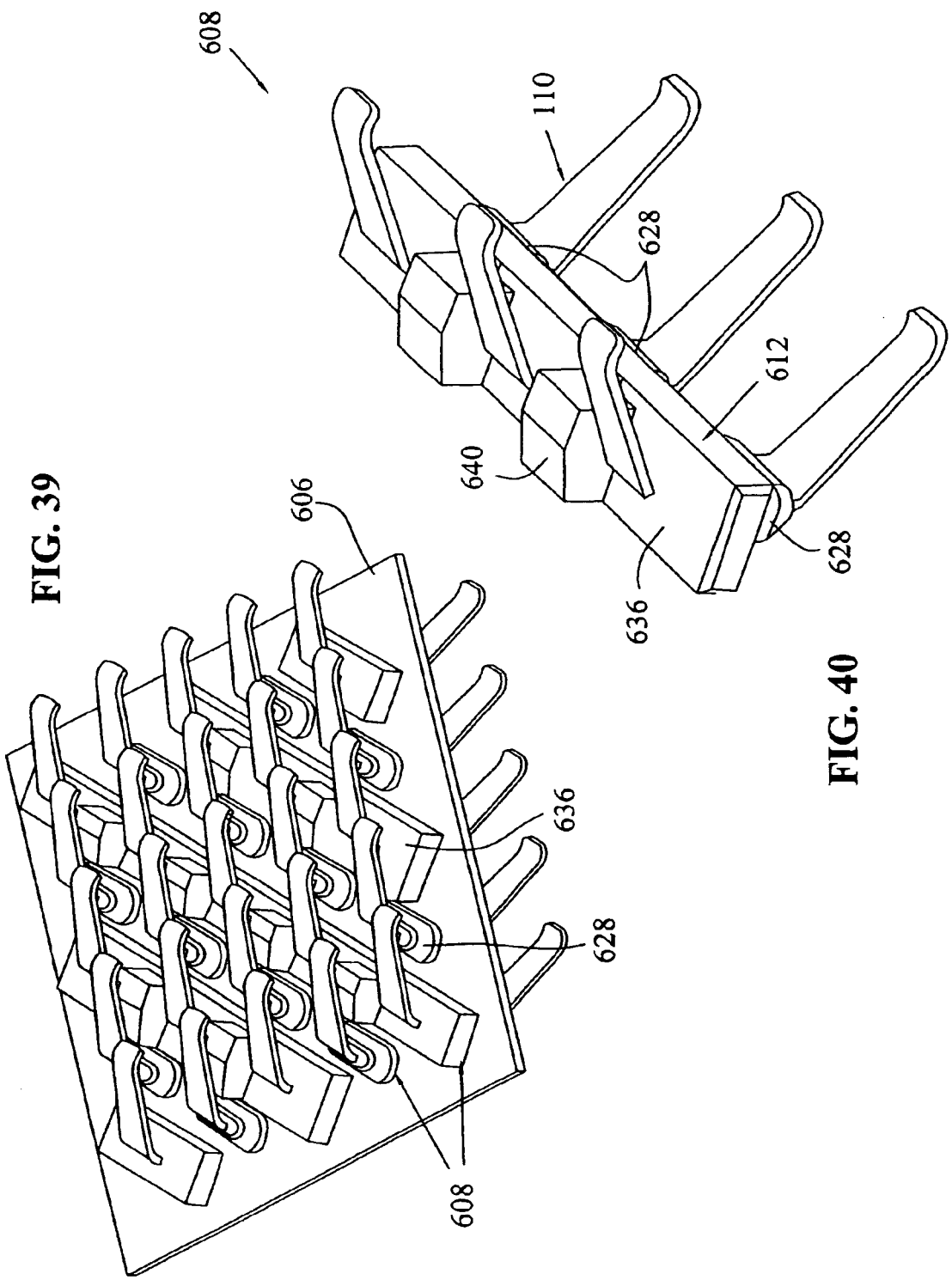
FIG. 39 shows plural contacts molded in a common insulative member with interstitial anti-overstress members intermediate the contacts to provide an overstress for adjacent contacts.
FIG. 40 is an enlarged view of one of the contacts and insulative members of FIG. 39.

FIGS. 39 and 40 show that a plurality of contacts 110 can be molded into a single elongate body 612 having a head portion 636 and plural shank portions 628. Each head portion 636 includes an interstitial anti-overstress member 640 to provide an overstress feature for a contact in the previous row, as shown in FIG. 39. The contact assemblies 608 can be alternatively positioned with alternative rows of head portions 636 and shank portions 628 extending from a particular side of the substrate 606.

Figure 41:
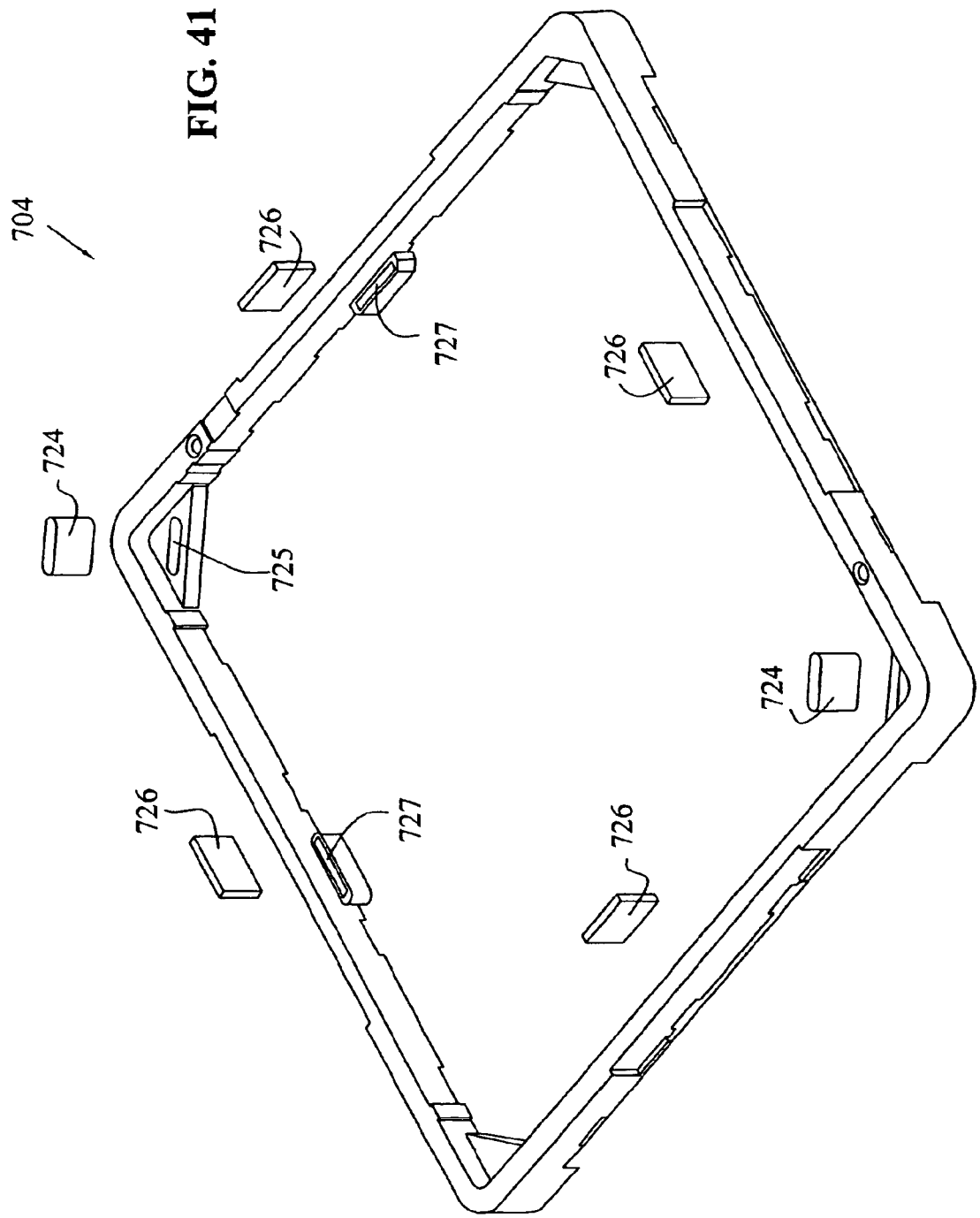
FIG. 41 shows alternative removable inserts for the stop members for the chip.

FIG. 41 shows an alternate embodiment of housing 704, where standoffs 724 and 726 are separate, discrete elements receivable in sockets 725 and 727, respectively, whereby inserts 724 and 726 are comprised of a material more rigid than the material of the housing. For example, metal, ceramic or any other material could be used as the inserts to prevent creep and distortion as the socket is utilized and heat-cycled.

Figure 43:
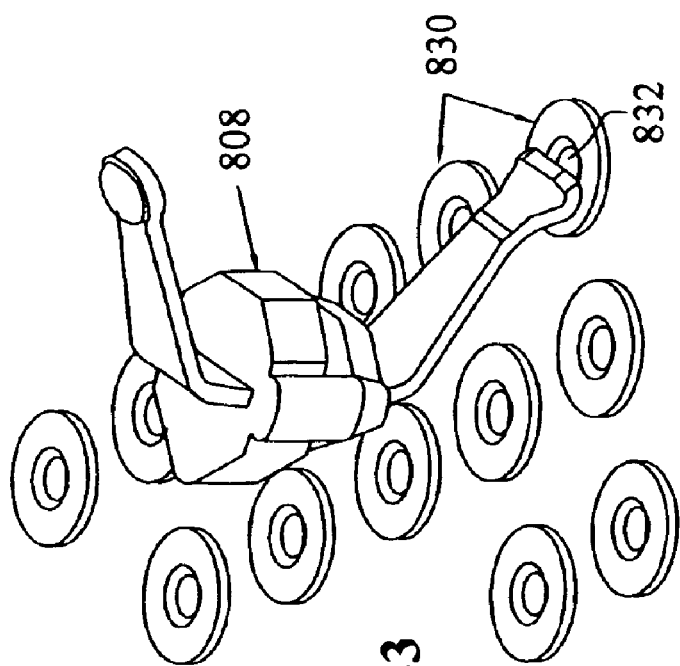
FIG. 43 shows the contact of FIG. 42 in contact with an individual via of a plurality of vias.
Figure 42:
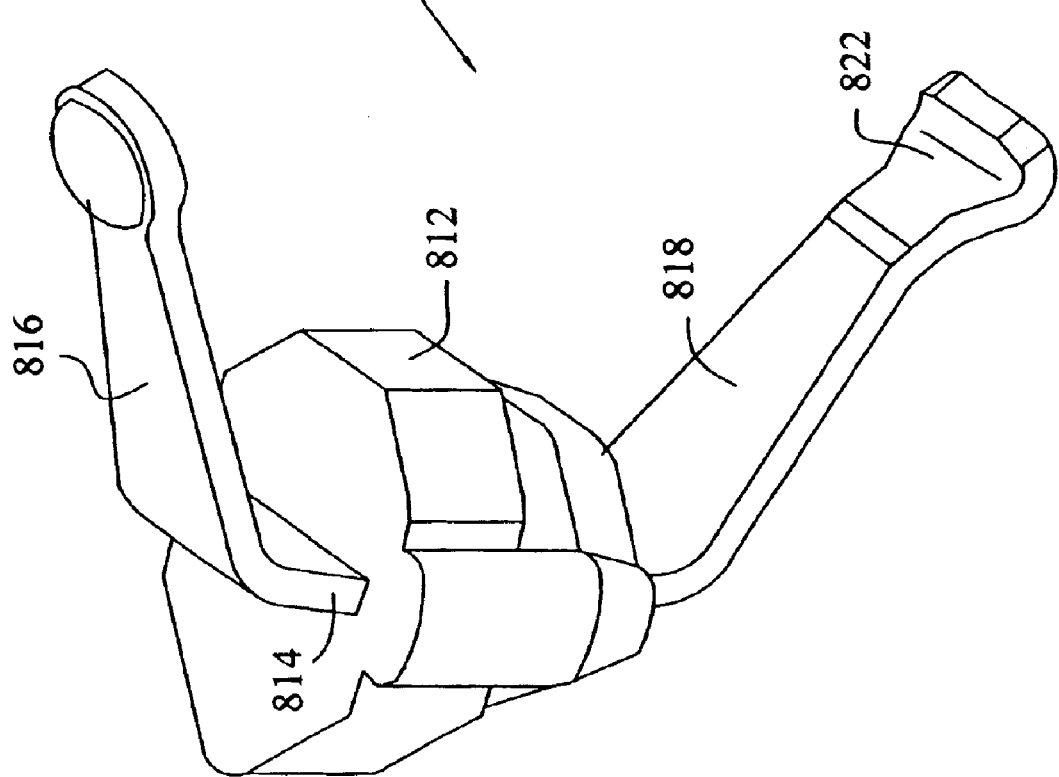
FIG. 42 shows a detailed view of a contact designed for interconnection to a plated via on a printed circuit board.

With respect now to FIGS. 42 and 43, an alternative contact assembly 808 is shown having a molded body 812, intermediate contact portion 814 having contact portions 816 and 818 extending therefrom, where contact portion 822 is defined with a wide foot portion defined to span a via hole 832 of a printed circuit board contact pad 830, as shown in FIG. 43.

Figure 44:
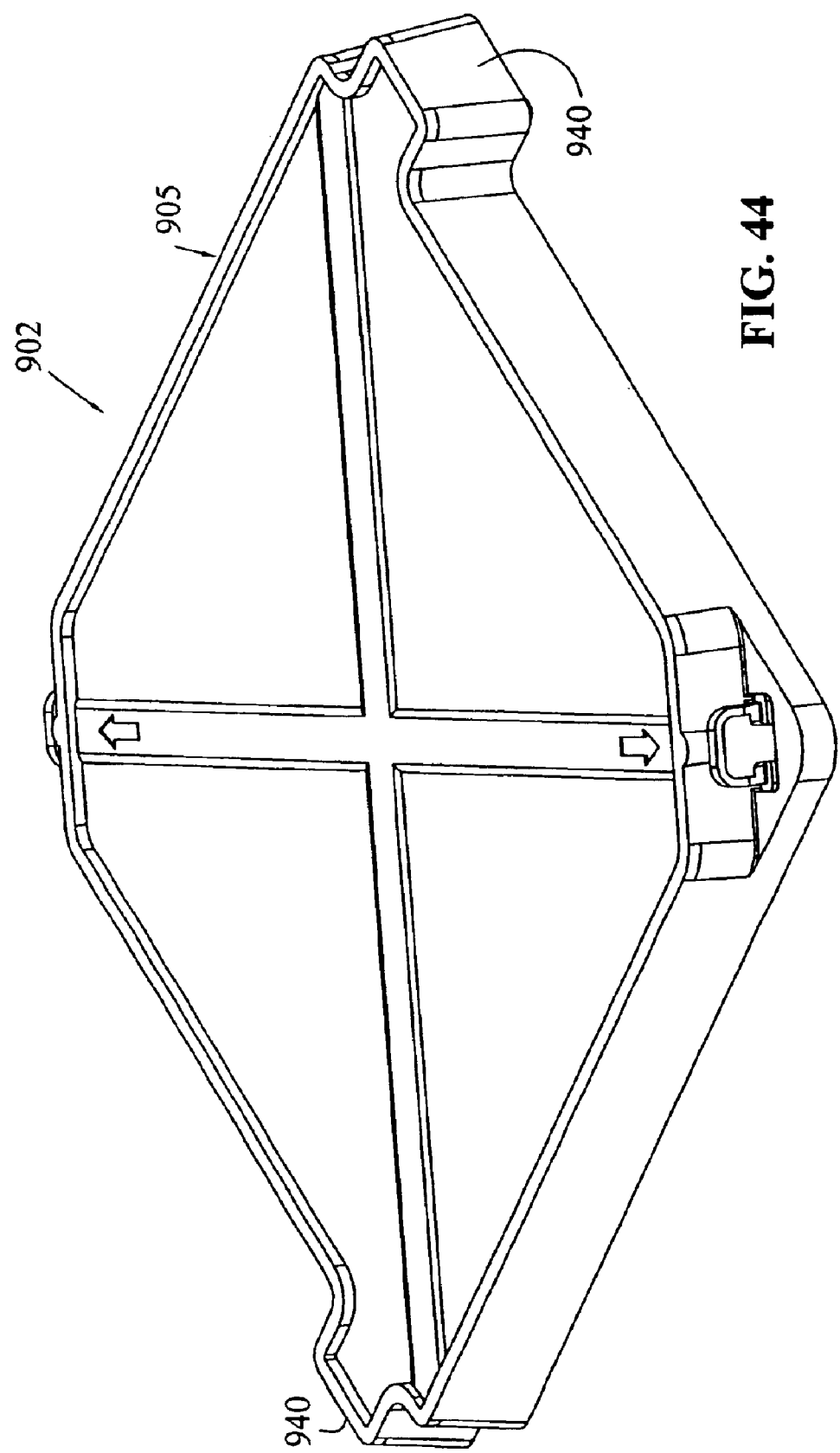
FIG. 44 shows a top perspective view of another embodiment of the LGA interconnect of the present invention.
Figure 45:
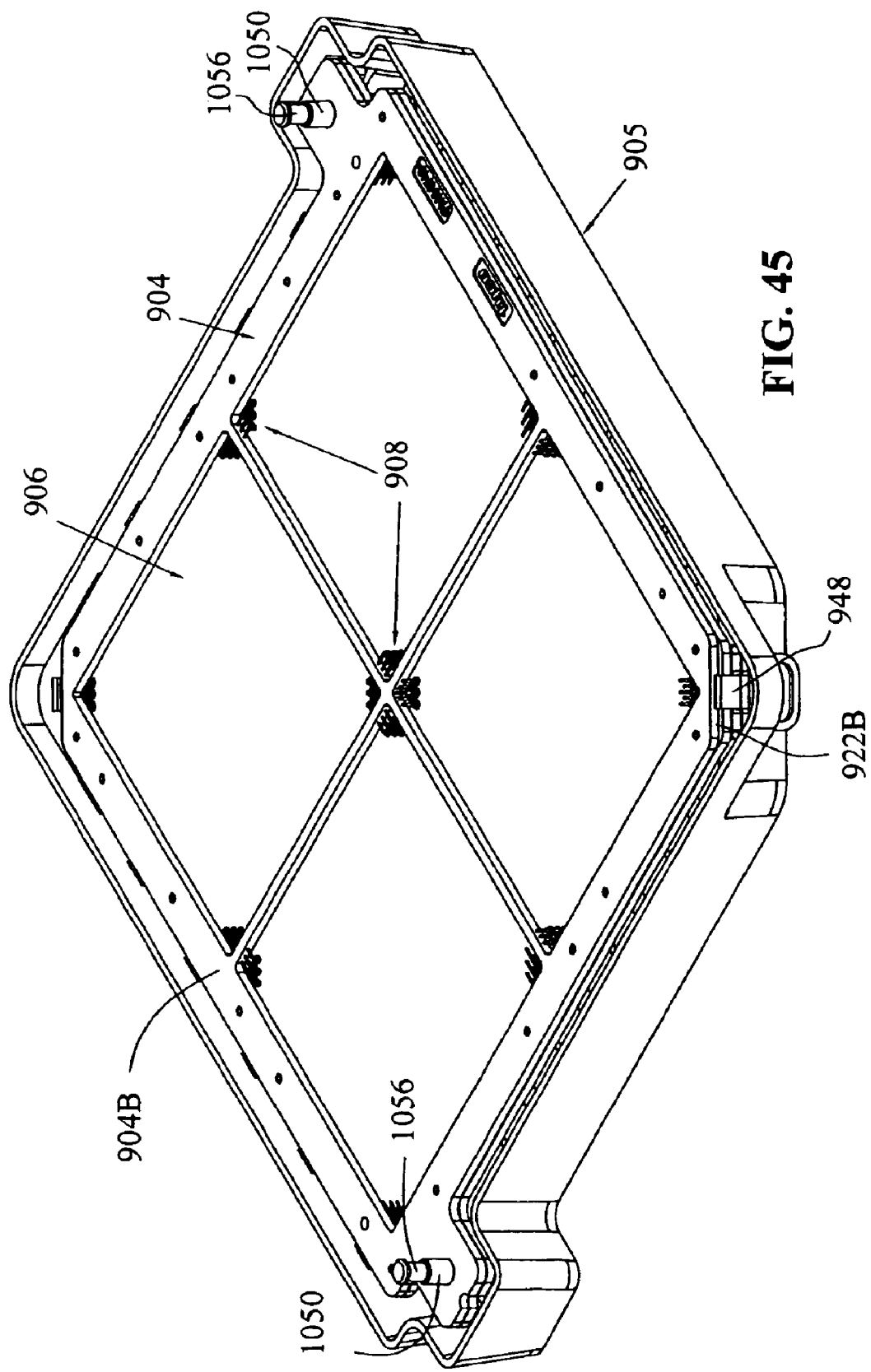
FIG. 45 shows a lower perspective view of the embodiment of FIG. 44.
Figure 46:
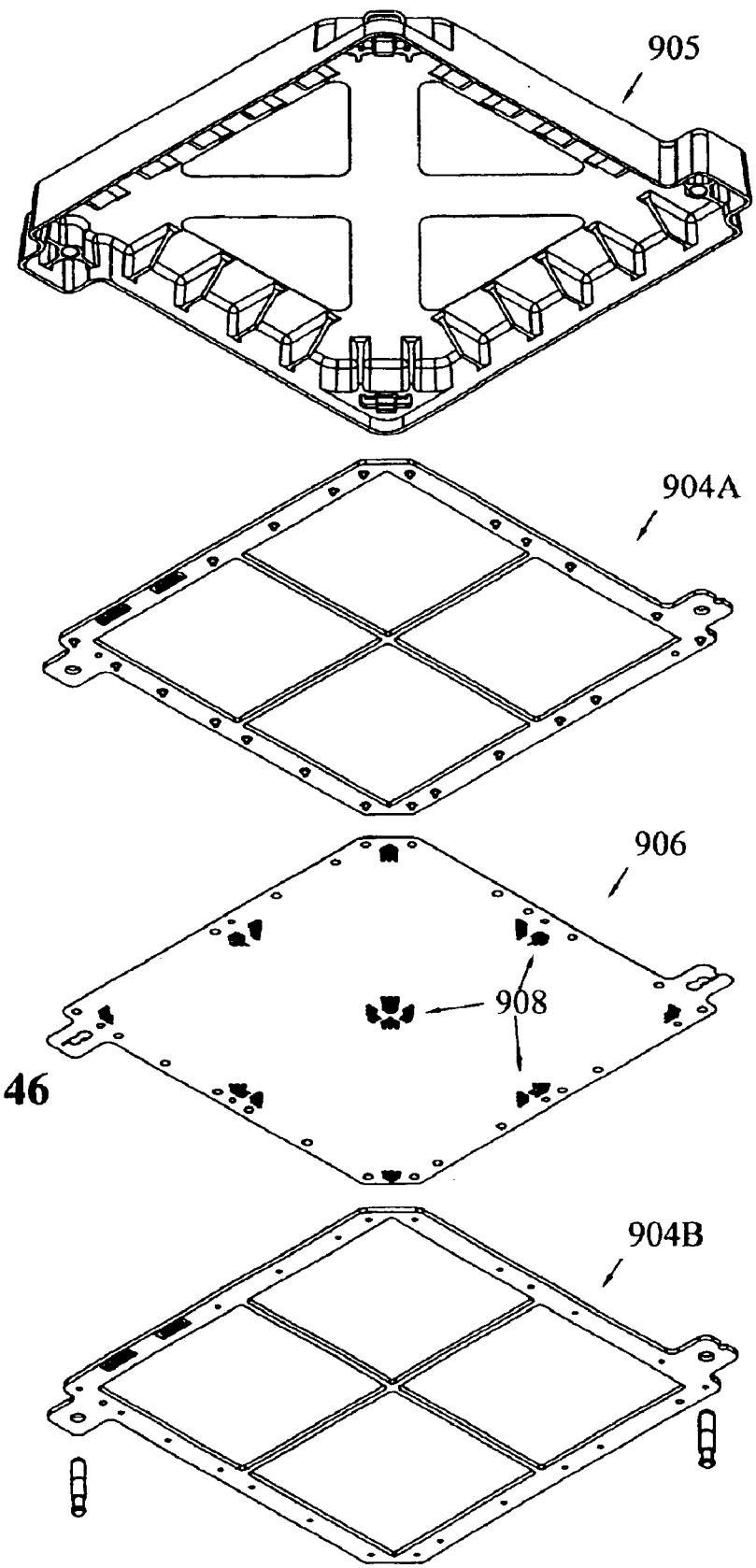
FIG. 46 shows an exploded view of the various components of the embodiment of FIG. 44.
Figure 47:
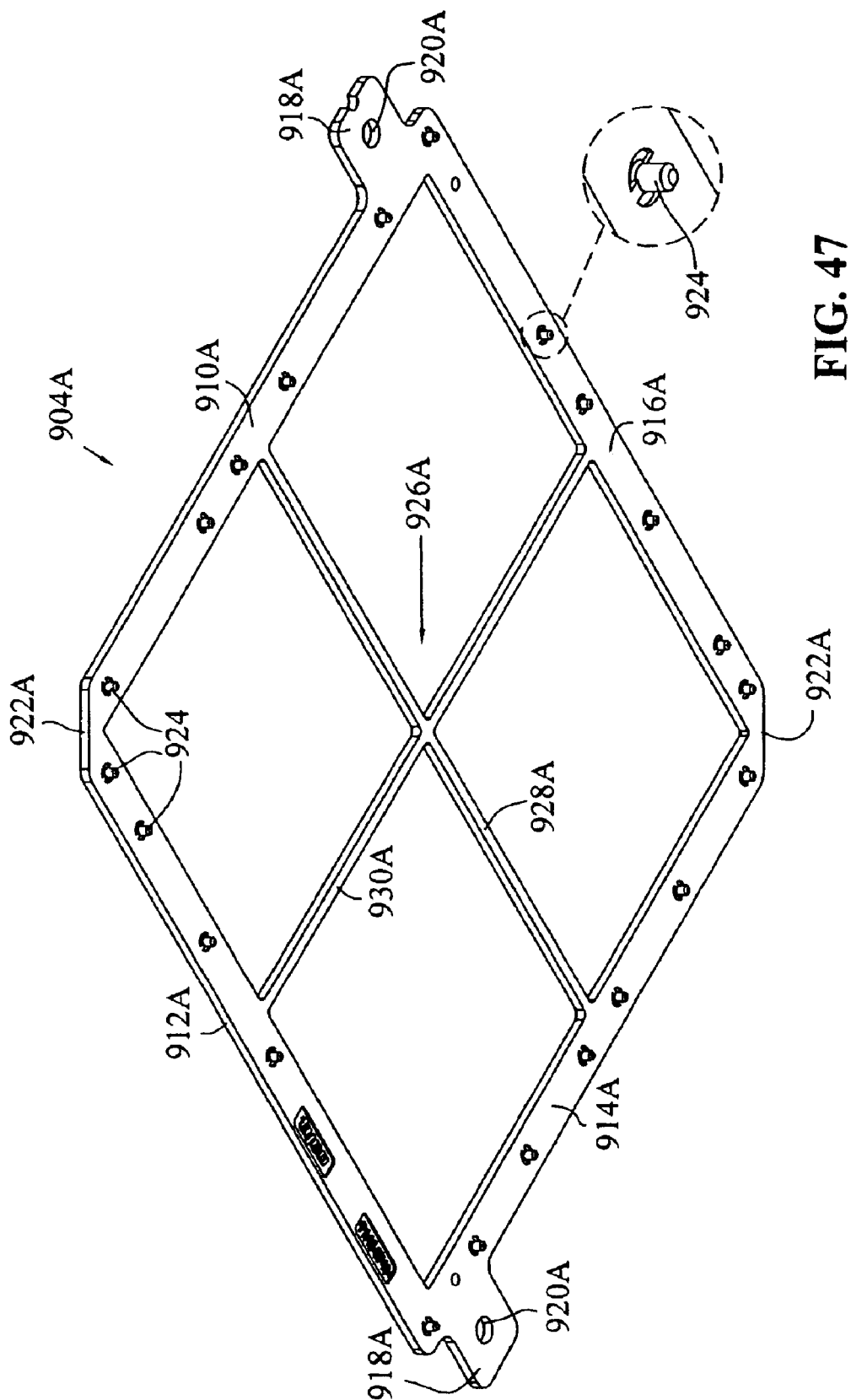
FIG. 47 shows a perspective view of a first frame member.

With respect now to FIGS. 44–60, yet another embodiment of the invention will be described. As shown in FIGS. 44–46, this embodiment is shown at 902 and includes a frame housing 904 comprised of first and second frame members 904A and 904B (FIG. 46), a cover 905, and a substrate 906 which carries a plurality of contact assemblies 908. With reference now to FIG. 47, frame housing portion 904A will be described in greater detail.

Frame housing portion 904A includes frame side wall portions 910A, 912A, 914A, and 916A. Frame housing portion 904A further includes extension ears 918A extending from diametrical corners having pin-receiving apertures 920A, as will be described further herein. At the other diametrical corners, frame housing portion 904A includes edges 922A. Alignment pins 924 extend downwardly from the frame housing 904A and are substantially cylindrical in cross section. Finally, frame support members 926A extend between opposing side edges of the frame housing 904A and is cruciform in configuration having a first member 928A and a second member 930A defining quadrants therebetween.

Figure 48:
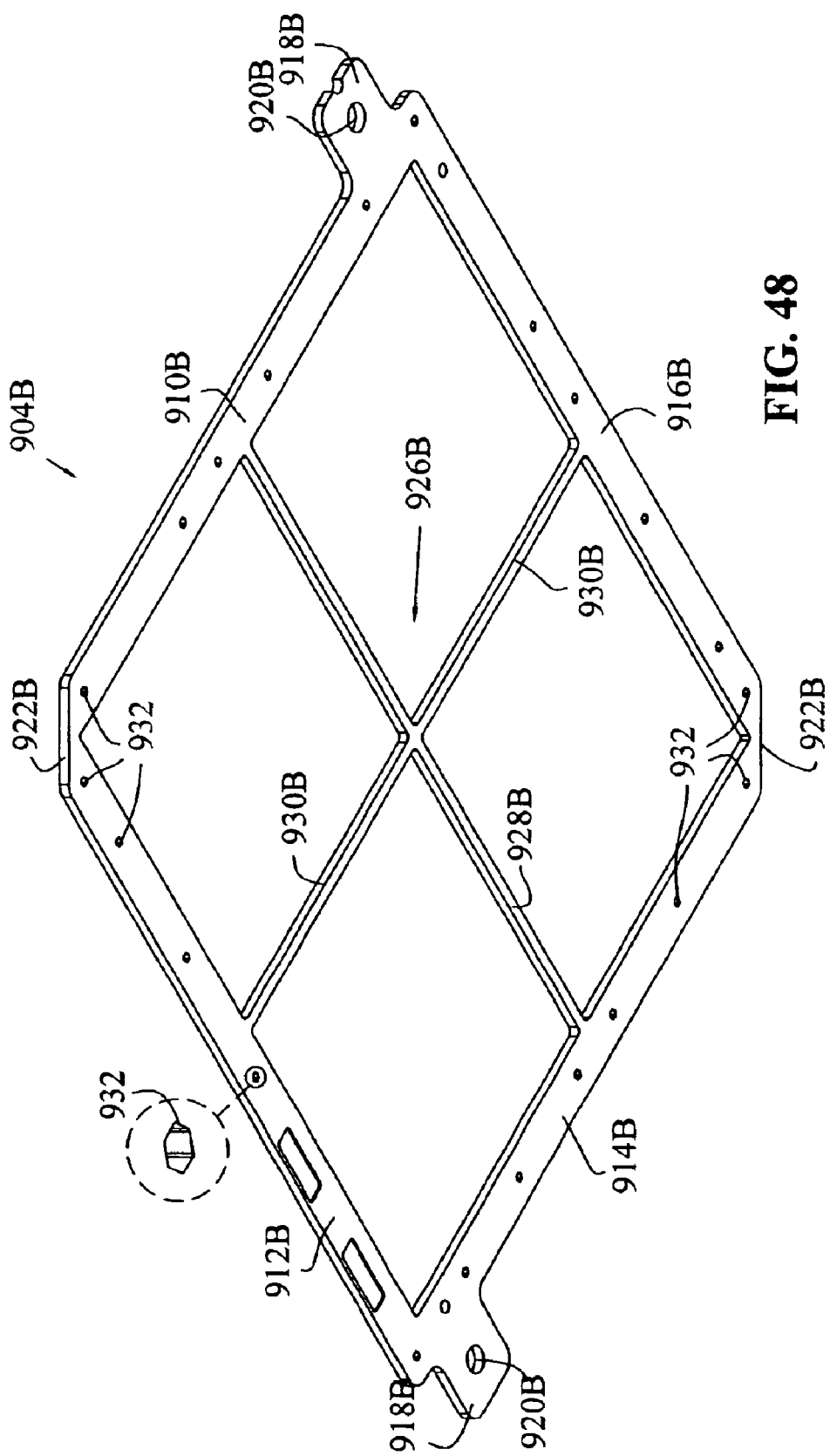
FIG. 48 shows a lower perspective view of a second frame member of the present embodiment.

With respect now to FIG. 48, frame housing portion 904B will be described in greater detail. It should be appreciated that frame housing portion 904B is complementary to frame housing portion 904A and is designed to trap therebetween the substrate member 906. With respect to FIG. 48, frame housing portion 904B includes side edge portions 910B, 912B, 914B, and 916B. In a similar manner to frame housing portion 904A, frame housing portion 904B includes extension ears 918B extending from diametrical corners having apertures 920B. The other corners include edges 922B. Frame housing portion 904B also includes frame support member 926B, having support members 928B and 930B. Finally, as shown in FIG. 48, frame housing portion 904B includes a plurality of hexagonal openings 932 in an array which matches the array of pins 924 on housing member 904A.

Figure 49:
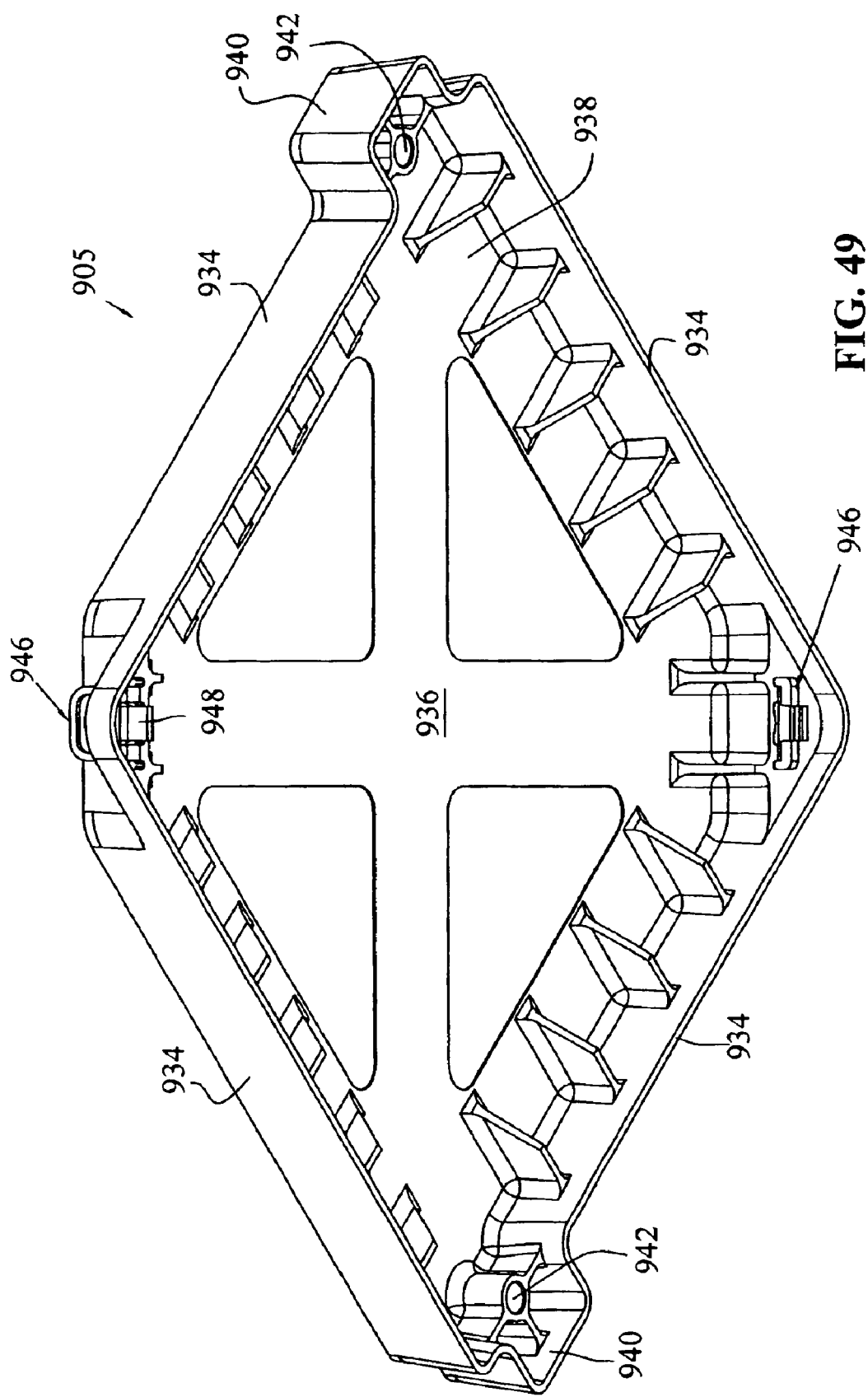
FIG. 49 shows an enlarged perspective view of the cover of the embodiment of FIG. 44.

With respect now to FIG. 49, cover 905 will be described in greater detail. As shown in FIG. 49, in an underside perspective view, cover 905 includes side walls 934 and top wall 936 defining an enclosure 938 therein. It should be appreciated that cover 905 is profiled to be received over the combination of frame housing portions 904A, 904B and the substrate 906. Thus, at each corner of cover 905, an extension portion 940 is provided and is profiled to be received over extension ears 918A and 918B. As best shown in FIG. 49, these extensions include apertures 942 for alignment purposes with the substrate directly as will be further described herein. In the opposite corners, latch members 946 are provided having latching arms 948, as best shown in FIGS. 45 and 49, and as will be described in further detail herein.

Figure 50:
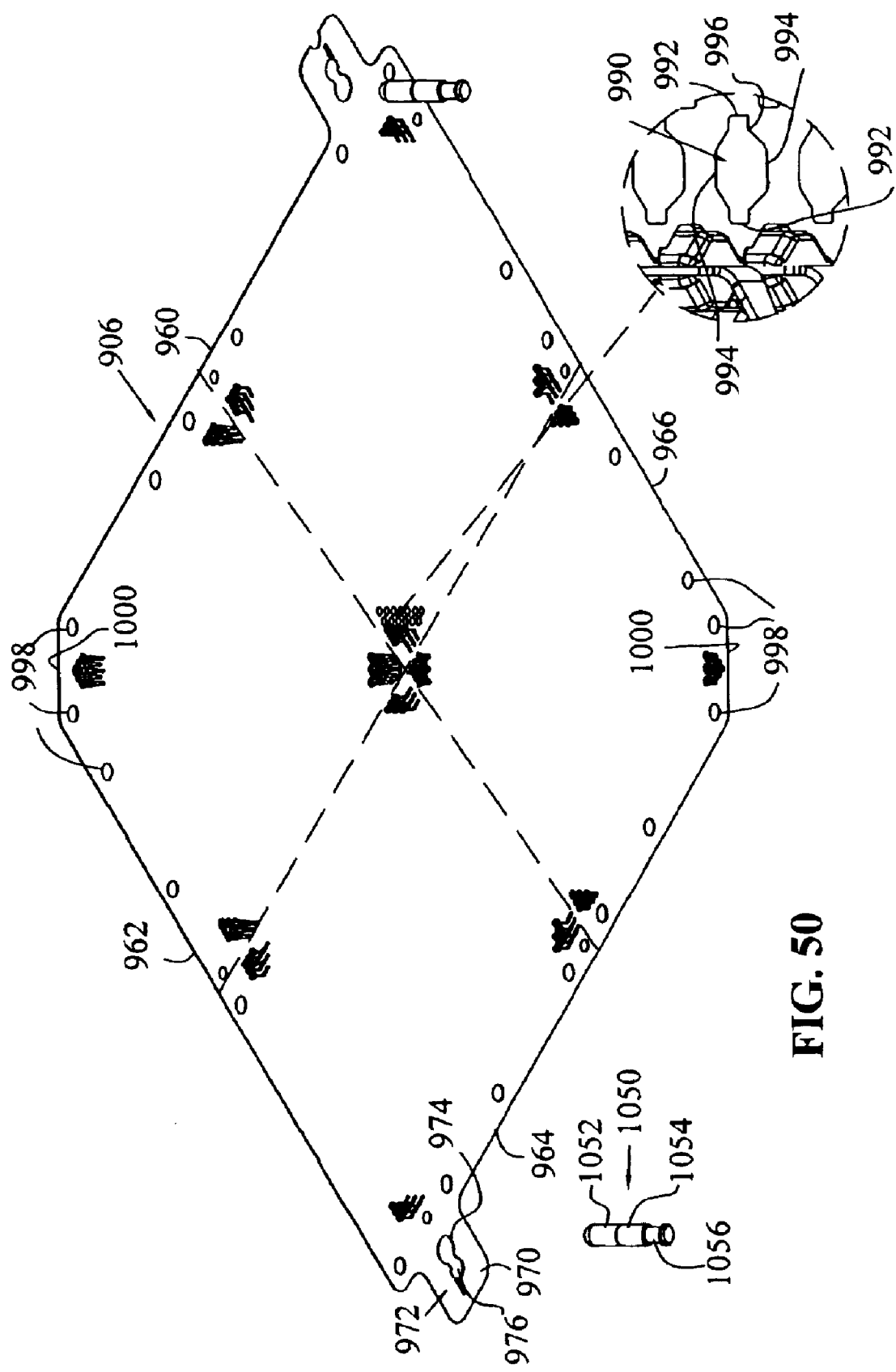
FIG. 50 shows a perspective view of the substrate of the embodiment.

With respect now to FIG. 50, substrate member 906 will be described. As shown in FIG. 50, substrate 906 is substantially rectangular in configuration. In fact, as shown in FIG. 50, substrate 906 is substantially square in cross section so as to define four equal quadrants, as will be described herein. Substrate 906 includes side edges 960, 962, 964, and 966. Diametrical corners include an extension portion 970 having an aperture 972. Aperture 972 is comprised of a receiving aperture 974 and a locating aperture 976. Aperture 972 and its operation are more fully described in Assignee's, simultaneously filed, patent application Ser. No. 10/788,884, the subject matter of which is incorporated herein by reference.

As shown in FIG. 50, substrate 906 further includes a plurality of apertures 990, whereby the apertures are defined in an array of quadrants, whereby at the intersection of the quadrants, each of the contacts generally faces the center of the substrate. As shown in FIG. 50, each aperture 990 includes end edges 992, side edges 994 and angled side edges 996. These apertures are substantially similar to those described above with respect to FIG. 12 and are profiled to receive the contact assemblies 908 therein. With respect still to FIG. 50, apertures 998 are provided, which are in alignment with cylindrical pins 924, but are larger in diameter than the pins 924. Substrate 906 further includes a side edge 1000 at diametrical corners of the substrate 906, as will be described further herein.

Figure 51:
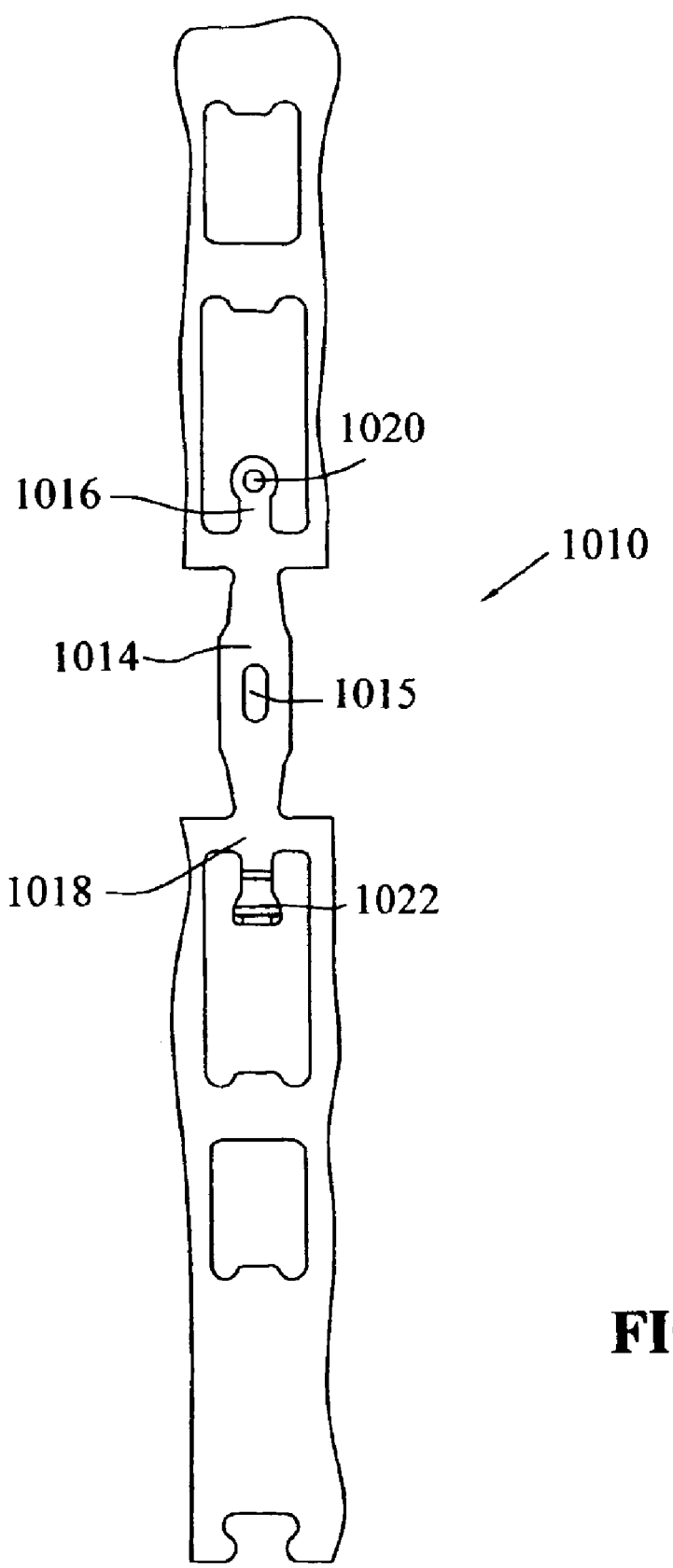
FIG. 51 shows a portion of a stamped lead frame showing the contact portion prior to overmolding the insert.
Figure 52:
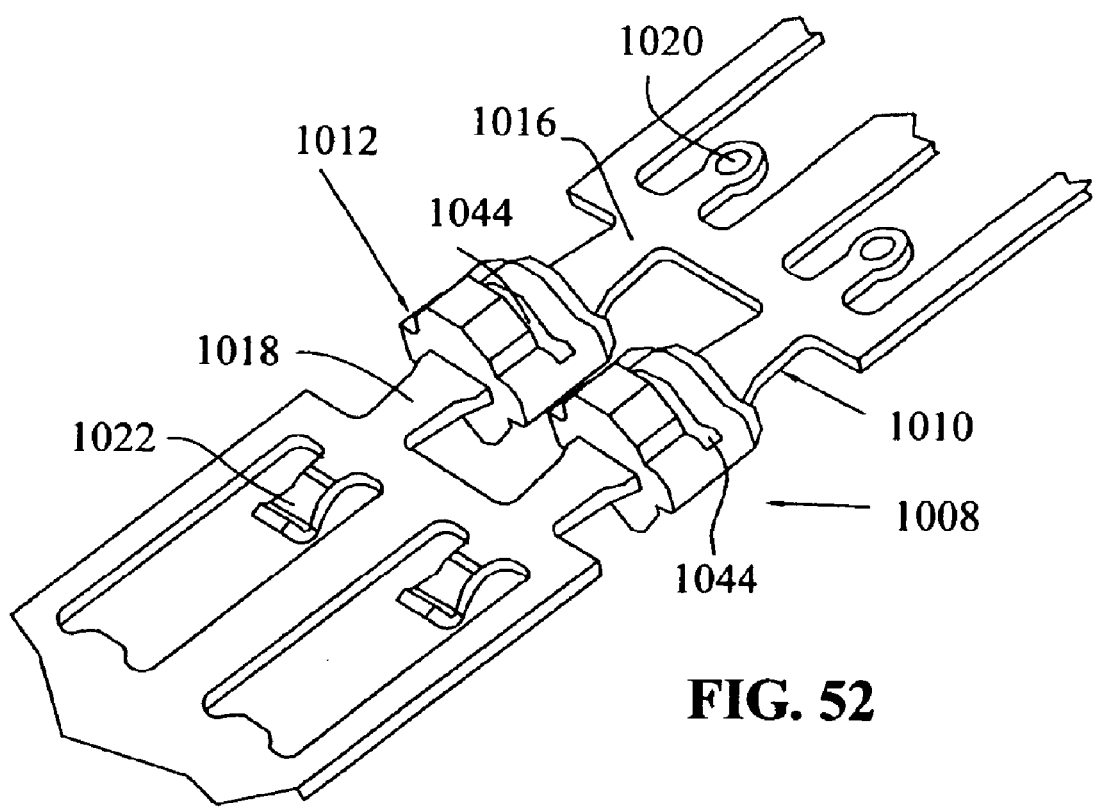
FIG. 52 shows the over-molded insert over the lead frame of FIG. 51.
Figure 53:
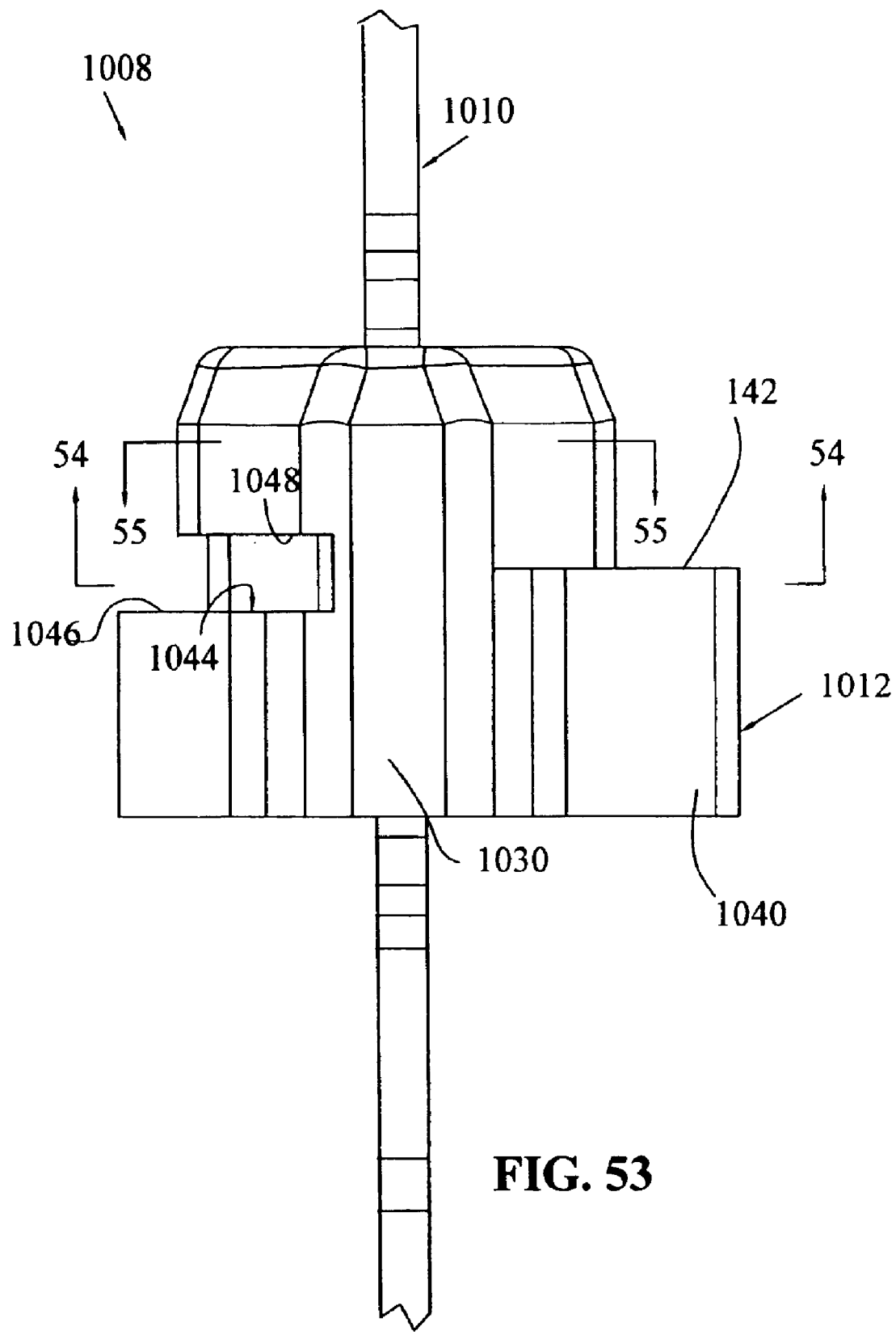
FIG. 53 shows a side view of the insert shown in FIG. 52.
Figure 54:
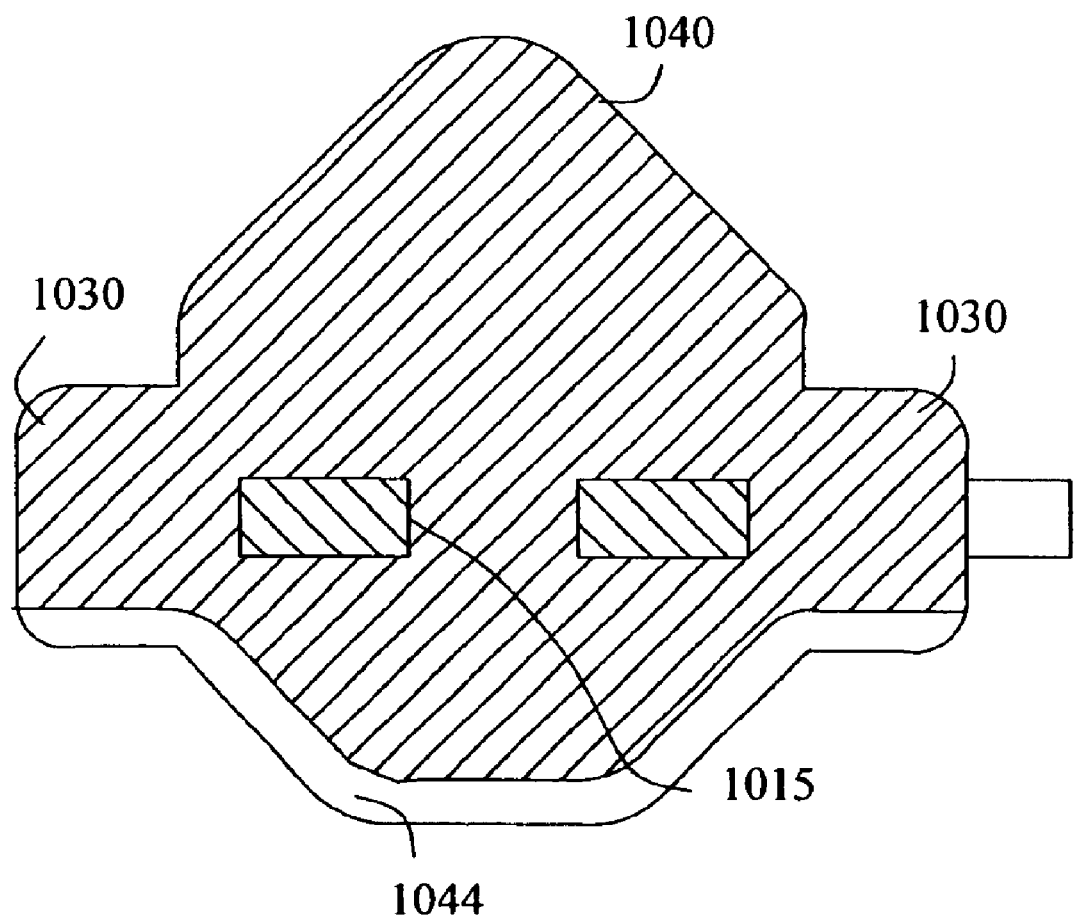
FIG. 54 is a cross-sectional view through lines 54—54 of FIG. 53.
Figure 55:
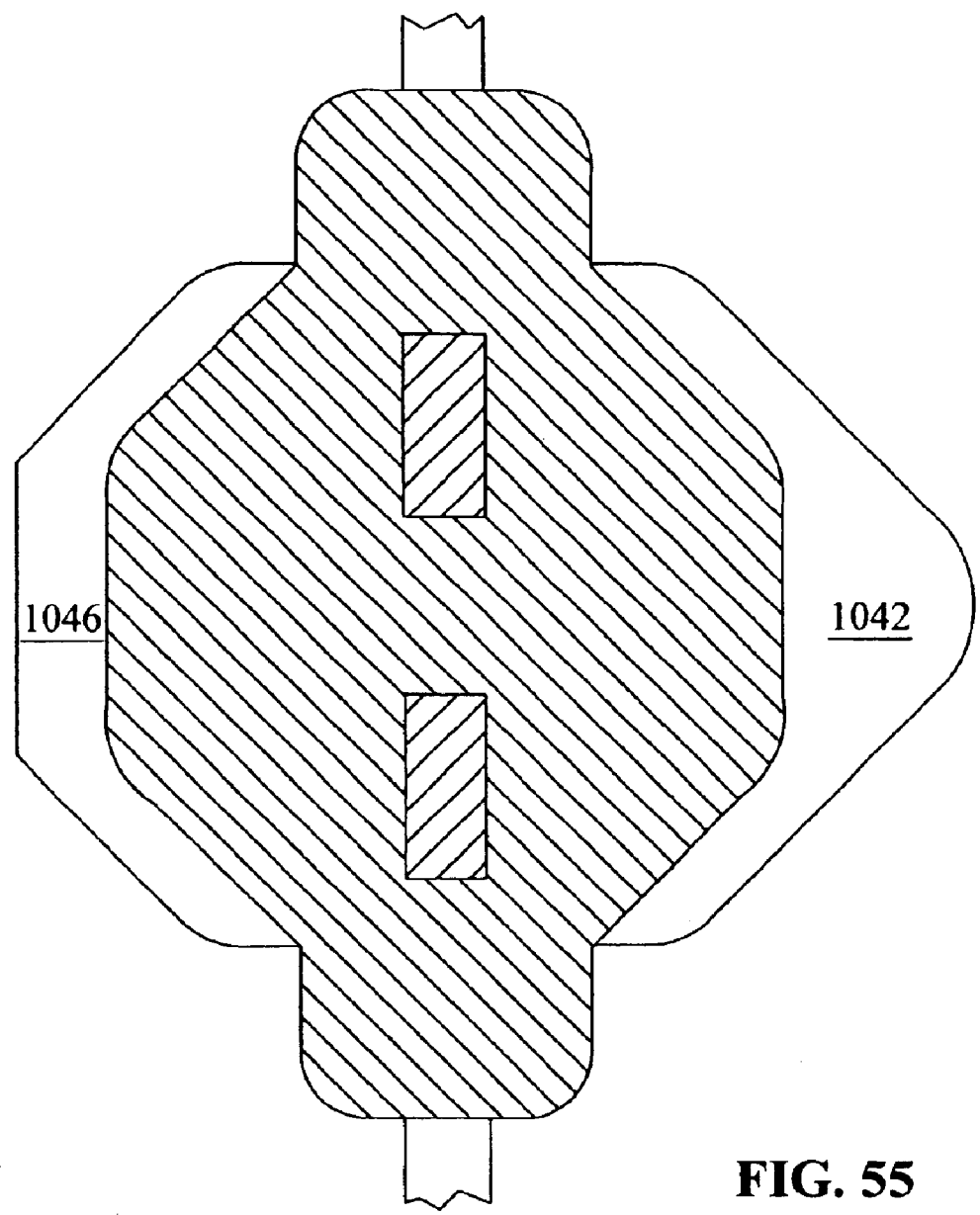
FIG. 55 is a cross-sectional view through lines 55—55 of FIG. 53.
Figure 56:
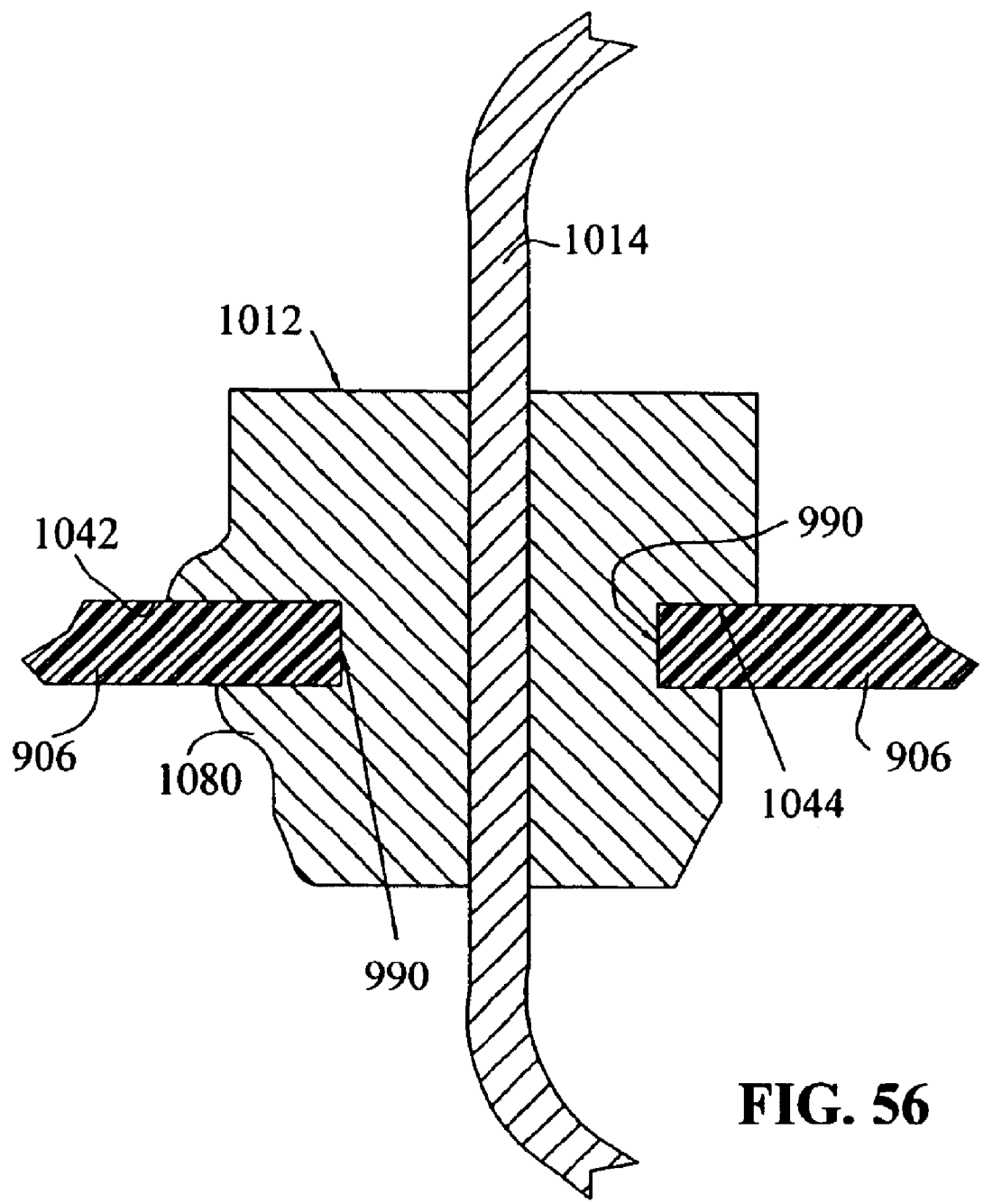
FIG. 56 is a cross-sectional view similar to that of FIG. 26.

With respect now to FIGS. 51–55, contact assemblies 1008 will be described in greater detail. As shown in FIG. 52, contact assembly 1008 includes a stamped terminal portion 1010 having an overmolded insert member 1012 overmolded thereto. As shown in FIG. 51, the stamped terminal 1010 includes a central portion 1014 having an elongate aperture 1015, with contact portions 1016 and 1018 extending from opposite sides thereof defining contact sections 1020 and 1022. With respect now to FIG. 53, insert 1012 is shown molded onto terminal portion 1010. It should be appreciated that insert 1012 is substantially similar to that described above with respect to FIGS. 13–15B. That is, insert 1012 includes a shank portion 1028, end portions 1030, head portion 1036, and projecting portion 1040. However, in addition, insert 1012 includes a slot 1044, which as shown in FIGS. 53 and 54, extends part way into end sections 1030. Slot 1044 defines opposing surfaces 1046 and 1048.

With respect again to FIG. 50, this embodiment further includes an alignment pin 1050 having a cylindrical portion 1052 having a recessed groove at 1054 and a reduced diameter portion 1056. As mentioned above, the substrate aperture 972 and its locking arrangement with alignment pin 1050 are more particularly described in application Ser. No. 10/788,884, which is incorporated herein by reference. With the components as described above, the assembly and application will now be described.

The substrate 906 is defined in a similar manner to that described above, where a substrate is defined with the characteristics shown in FIG. 50. While the substrate could be made from many different materials, such as Mylar, ceramic, plastic, or metal, this embodiment utilizes a stainless steel substrate, where the specific characteristics, such as the apertures 990 and the detail of apertures 998 and 972, are defined by an etching process. However, it should be recognized that some embodiments could be provided by a stamping process. In either event, in this embodiment apertures 990 are formed in quadrants about the substrate, as mentioned above.

With respect now to FIG. 51, the terminals are provided by a process to define a lead frame similar to that shown in FIG. 51. The contacts are defined by a metal having a spring characteristic, such as a beryllium copper, and is shown as being stamped and formed to define its characteristics. However, it should also be appreciated that an etching process could also be incorporated to accommodate tight tolerances as the contact density increases.

Insert 1012, shown in FIG. 52, is now overmolded about the central portion 1014 of the contact, whereby elongate aperture 1015 is used as a sprue for the molten plastic to ensure a complete molded insert. The aperture 1015 also provides for a retention mechanism for the insert longitudinally along the length of the terminal. The contact assemblies 1008 are now inserted in their respective passageways 990, and it should be appreciated that slot 1044, as shown in FIGS. 53 and 54, will conform within a respective aperture 990 to receive an edge of the aperture 990 therein. The inserts are now swaged in a manner similar to that described above with respect to FIGS. 22 and 23 above, whereby the plastic insert is deformed to a position shown in FIG. 56. The insert laterally shifts to position the edge of the aperture 990 within the slot 1044, and with surfaces 1042 and swaged projection 1080 gripping the opposite edge of the substrate 906. Locating pins 1050 are now locked within aperture portion 976 of locating apertures 972, which fixedly attaches and locates locating pins 1050 relative to substrate 906.

Figure 57:
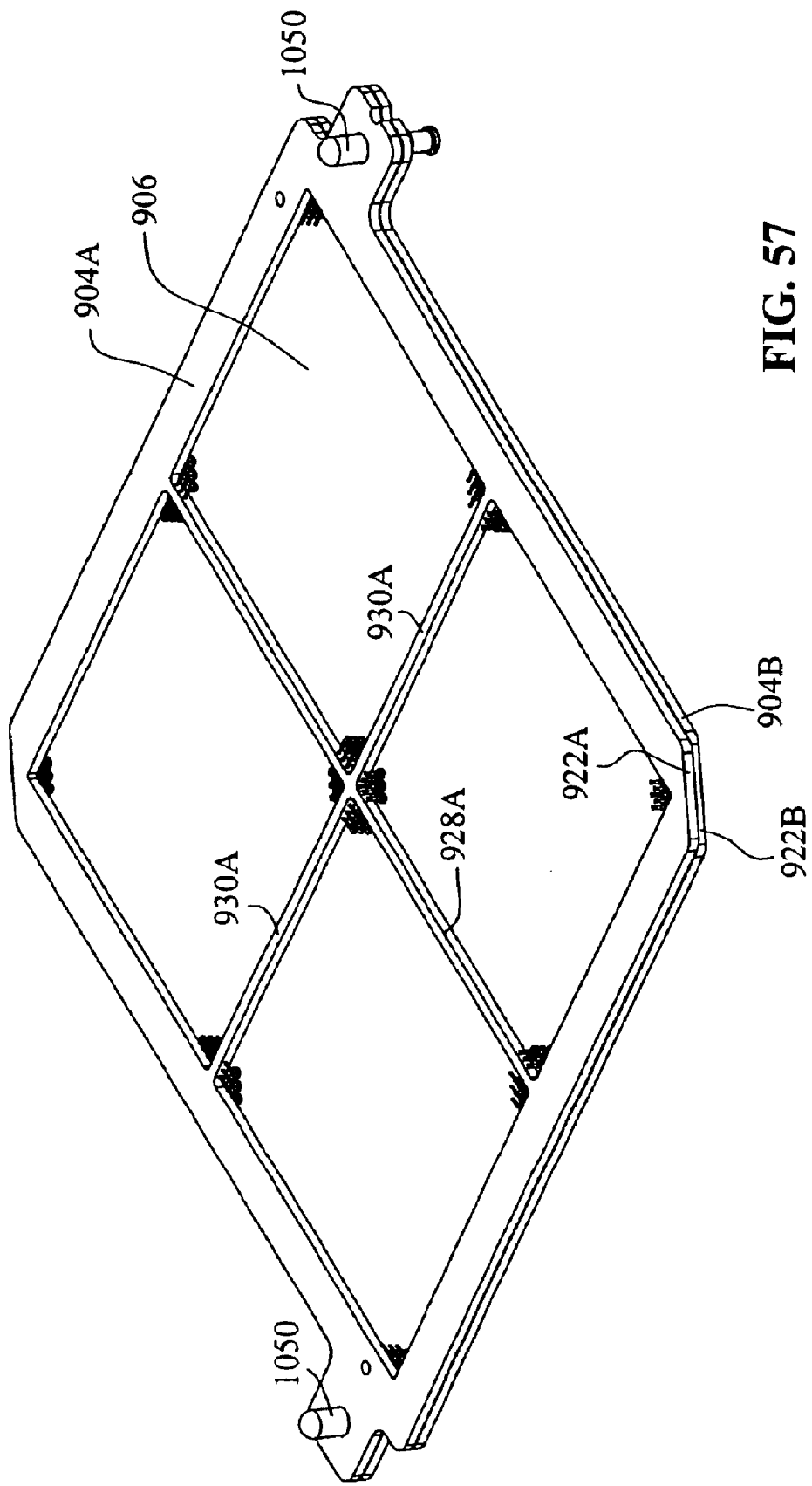
FIG. 57 is a perspective view of the assembled substrate and upper and lower frame members.

At this stage, all contact assemblies are inserted in, and the locating pins 1050 are fixedly secured to, substrate 906. The frame housing members 904A and 904B may now be positioned with respective apertures 920A, 920B over the locating pins 1050, which positions the frame support members 928A, 930A; 928B, 930B (FIGS. 47 and 48) intermediate the quadrants of contact assemblies, as best shown in FIGS. 57 and 58. The two frame housing members 904A and 904B are press-fit together, due to the interference fit between cylindrical pins 924 (FIG. 47) and their respective receiving apertures 932 (FIG. 8) to provide an interference fit between the cylindrical pin and hexagonal aperture, as best shown in the exploded view of FIG. 59.

Figure 60:
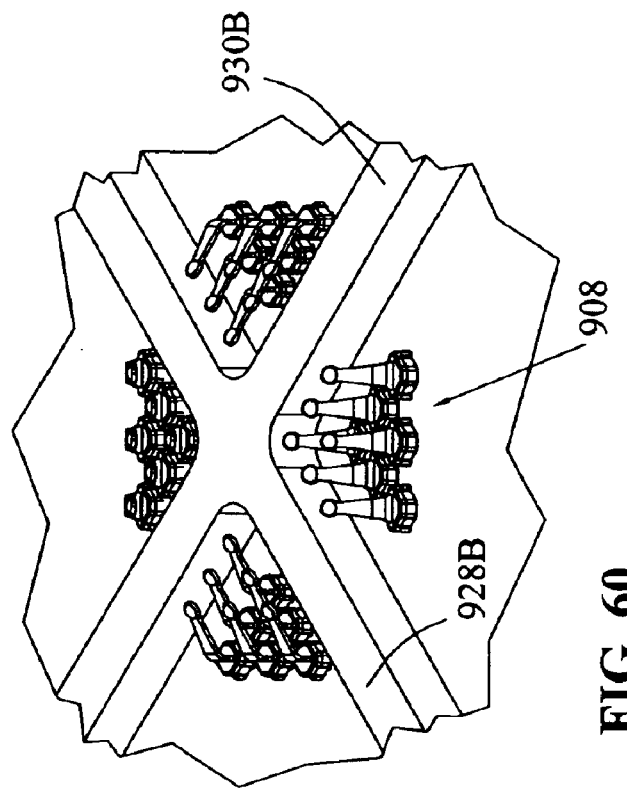
FIG. 60 shows an enlarged view of the central portion of the substrate denoted in FIG. 58.
Figure 59:
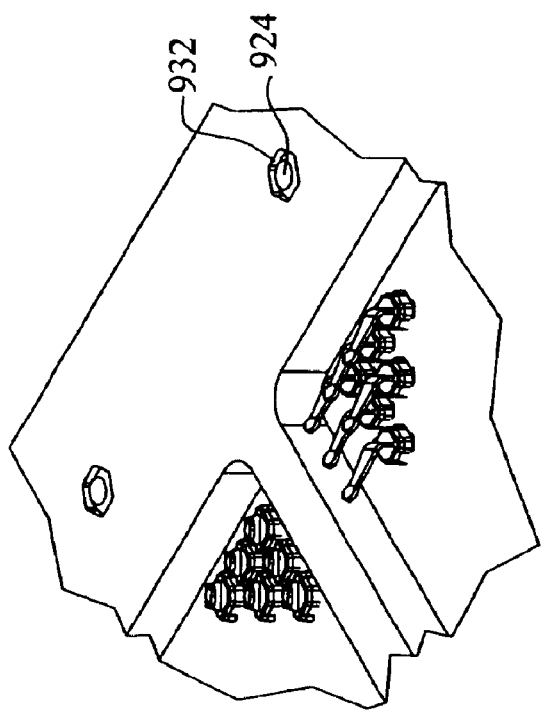
FIG. 59 is an enlarged view of a portion of the frame and contact members denoted in FIG. 58.

As best shown in FIG. 60, the contact assemblies 908 are assembled in quadrants about the support members 928B and 930B to define an array of contacts for interconnection to a further electrical component. It should also be appreciated that the support members 928A, 930A; 928B, 930B act to both rigidify the substrate 906 as well as to provide for a positive stop position for the electrical component to which the LGA interconnect 902 is applied. Said differently, if the LGA interconnect 902 is applied intermediate to two printed circuit boards, the two circuit boards could be assembled to the interconnect 902, such that the two printed circuit boards are drawn together to a position where the circuit boards contact the support members 928A, 930A; 928B, 930B.

With reference again to FIGS. 57 and 58, it should be appreciated that the edges 922A overlap their respective edges 922B, thereby defining a latching edge. With the upper device now positioned against frame housing portion 904A, cover 905 can be positioned over the assembly of the frame housing 904 and substrate 905 and latches 946 (FIG. 49) can latch over the overlapping edge 922A, as best shown in FIG. 45, while at the same time, cylindrical pin portions 1052 (FIG. 50) may be received in their receiving apertures 942 (FIG. 49) of cover 905. An underside perspective view of the embodiment as assembled is shown in FIG. 45, with the remainder of pin 1050, and the reduced diameter portions 1056 extending from the frame housing portion 904B for further alignment and connection to, a further electrical device.

Thus, in the embodiment of FIGS. 44–60, the contact assemblies 908 have enhanced retention to their substrate 906 by way of the slot 1044 (FIGS. 52 and 53) being positioned against an edge of its respective aperture 990 (FIG. 56) which provides for a retention of the plastic insert 1012 on both sides of the aperture 990, against respective surfaces 994 (FIG. 50). Furthermore, the support members 928A, 928B; 930A, 930B allow for proper positioning of an electrical component against the interconnect 902 providing adequate contact force, but preventing overstressing of the contact assemblies. Furthermore, and as best shown in FIG. 60, the contacts are arranged in quadrants such that all frictional components of forces cancel each other out, thereby preventing any lateral forces from being transferred to the interconnected component causing degradation of the electrical connection.

What is claimed is:

1. An LGA interconnect, comprising a rigid metal substrate and a plurality of contact assemblies, said substrate having a plurality of apertures therethrough arranged in an array, each said contact assembly comprised of at least one metal contact and an insulative member attached to and overmolded on said metal contact, said insulative member being positioned in said aperture, positioning a first contact member of said metal contact above said substrate and a second contact of said metal contact below said substrate, said insulative member isolating said metal contact from said substrate.

2. The LGA interconnect of claim 1, wherein said insulative member also retains said contact assembly to said substrate.

3. The LGA interconnect of claim 2, wherein said metal contact is comprised of an intermediate base portion with said first and second contact members extending from opposite ends thereof.

4. The LGA interconnect of claim 3, wherein said insulative member is overmolded at said intermediate portion.

5. The LGA interconnect of claim 4, wherein said overmolded insulative member has a head portion larger than said aperture and a shank portion profiled to be received in said aperture.

6. The LGA interconnect of claim 5, wherein said overmolded insulative member is made of plastic material.

7. The LGA interconnect of claim 5, wherein said shank portion comprises a slot profiled to be received in an edge of said substrate, adjacent said aperture.

8. The LGA interconnect of claim 7, wherein the shank portion of said overmolded insulative member is swaged, with said slot in an overlapping position with said edge of said aperture, and said shank portion is deformed against said substrate, retaining said overmolded insulative member and said contact within said aperture.

9. The LGA interconnect of claim 1, wherein said first and second contact members extend as cantilever beams from said insulative member.

10. The LGA interconnect of claim 9, wherein said contact assemblies are arranged on said substrate with said cantilever beams oriented at an angle as measured about an axial centerline through said apertures, which is normal to said substrate.

11. The LGA interconnect of claim 10, wherein said angle is approximately 45 degrees.

12. The LGA interconnect of claim 10, wherein said contact assemblies are arranged in at least two arrays with the cantilever beams extending opposed.

13. The LGA interconnect of claim 12, wherein said contact assemblies are arranged in quadrants, with all cantilever portions projecting generally towards a geometrical center of said substrate.

14. The LGA interconnect of claim 12, wherein said at least two arrays are aligned along at least one diagonal line across said substrate.

15. The LGA interconnect of claim 14, wherein said at least two arrays are aligned along plural diagonal lines.

16. The LGA interconnect of claim 14, wherein each insulative member comprises plural metal contacts positioned therein.

17. The LGA interconnect of claim 16, wherein said insulative member is overmolded around said contacts.

18. The LGA interconnect of claim 17, wherein said insulative member includes interstitial stops intermediate the contacts, to provide a stop member for contacts in another row.

19. The LGA interconnect of claim 18, further comprising overstress stops positioned on said substrate to provide a stop position for said printed circuit board and said chip.

20. The LGA interconnect of claim 1, further comprising a housing member extending around a periphery of said substrate.

21. The LGA interconnect of claim 20, wherein said housing is insulative.

22. The LGA interconnect of claim 21, wherein said substrate is retained to said housing by overmolding said housing around a periphery of said substrate.

23. The LGA interconnect of claim 22, wherein said housing is overmolded in sections.

24. The LGA interconnect of claim 20, wherein said housing member has a substrate receiving surface with a plurality of extending pins, and said substrate has a like plurality of aligning apertures secured over said pins.

25. The LGA interconnect of claim 24, wherein said apertures include openings in a surrounding relationship to said apertures, defining resilient spring edges at said apertures.

26. The LGA interconnect of claim 1, further comprising stop members located along said housing to provide stop positions for said chip.

27. The LGA interconnect of claim 26, wherein said stop members are integrally formed in said housing.

28. The LGA interconnect of claim 27, wherein said stop members are inserts having more rigidity than the material which forms the housing.

29. An LGA interconnect comprising a substrate having an upper surface and a lower surface and a plurality of apertures therethrough arranged in an array, said substrate having housing walls positioned around a periphery of said substrate, and upstanding at least from said upper surface, and a plurality of contact assemblies positioned in said plurality of apertures, each contact assembly comprised of at least one metal contact and an insulative member, said insulative member being overmolded on said metal contact with the metal contact having a first contact portion projecting above said substrate upper surface, and a second contact portion projecting below said lower surface, said insulative member being positionable in said aperture, isolating said metal contact from said substrate wherein said first contact portion of a first of said plurality of contact assemblies faces said first contact portion of a second of said plurality of contact assemblies, wherein said overmolded insulative member has a head portion larger than said aperture and a shank portion profiled to be received in said aperture, and said shank portion comprises a transverse slot profiled to be received in an edge of said substrate, adjacent said aperture.

30. The LGA interconnect of claim 29, wherein said substrate is comprised of metal.

31. The LGA interconnect of claim 29, wherein said metal contact is comprised of an intermediate base portion with said first and second contact portions extending from opposite ends thereof.

32. The LGA interconnect of claim 31, wherein said insulative member is overmolded at said intermediate portion.

33. The LGA interconnect of claim 29, wherein said overmolded insulative member is made of plastic material.

34. The LGA interconnect of claim 29, wherein the shank portion of each said overmolded insulative member is swaged, positioning said slot in an overlapping position with said edge of said aperture, and said shank portion being deformed against said substrate, retaining said overmolded insulative member and said contact within said aperture.

35. The LGA interconnect of claim 29, wherein said housing is overmolded around a periphery of said metal substrate.

36. The LGA interconnect of claim 35, wherein said housing is overmolded is sections.

37. The LGA interconnect of claim 29, wherein said housing has a substrate receiving surface with a plurality of extending pins, and said substrate has a like plurality of aligning apertures secured over said pins.

38. The LGA interconnect of claim 37, wherein said apertures include openings in a surrounding relationship to said apertures, defining resilient spring edges at said apertures.

39. The LGA interconnect of claim 29, wherein said contact assemblies are arranged in at least two arrays with the cantilever beams extending opposed.

40. The LGA interconnect of claim 39, wherein said contact assemblies are arranged in quadrants, with all cantilever portions projecting generally towards a geometrical center of said substrate.

41. The LGA interconnect of claim 39, wherein said at least two arrays are aligned along at least one diagonal line across said substrate.

42. The LGA interconnect of claim 41, wherein said at least two arrays are aligned along plural diagonal lines.

43. The LGA interconnect of claim 41, wherein each insulative member comprises plural metal contacts positioned therein.

44. The LGA interconnect of claim 43, wherein said insulative member is overmolded around said contacts.

45. The LGA interconnect of claim 44, wherein said insulative member includes interstitial stops intermediate the contacts, to provide a stop member for contacts in another row.

46. The LGA interconnect of claim 29, further comprising overstress stops positioned on said substrate to provide a stop position for said contacts.

47. The LGA interconnect of claim 29, further comprising stop members located along said housing to provide stop positions for said chip.

48. The LGA interconnect of claim 47, wherein said stop members are integrally formed in said housing.

49. The LGA interconnect of claim 47, wherein said stop members are inserts having more rigidity than the material which forms the housing.

50. A method of making an array of contacts for interconnecting two planar electrical components, comprising the steps of:
providing a substrate to define a perimeter edge and an array of apertures therethrough;
forming a plurality of metal contacts to each include an intermediate portion, an upper contact portion extending from an upper portion of said intermediate portion and a lower contact portion extending downwardly from said intermediate portion;
positioning said intermediate portions of said metal contacts through said apertures;
isolating said metal contacts from said substrate by an insulator; and
affixing said metal contacts to said substrate by cold forming of said insulator to said substrate.

51. The method of claim 50, wherein the apertures are provided by an etching process.

52. The method of claim 50, wherein the rigid substrate is retained to the housing by interfering pins on said housing and apertures in said metal substrate.

53. The method of claim 50, wherein said substrate is provided as a rigid substrate.

54. The method of claim 53, wherein said rigid substrate is provided as a metal substrate.

55. The method of claim 50, wherein said metal contacts are isolated from said metal substrate by molding an insulative insert over said intermediate portion.

56. The method of claim 55, wherein said overmolded insert is molded to include a head portion which is larger than said apertures and a shank portion which is receivable in said apertures.

57. The method of claim 56, wherein said overmolded inserts are held in place in said substrate by swaging said shank portions to enlarge at least a portion of said shank portions to a dimension larger than said aperture.

58. The method of claim 57, wherein said head portion, at the intersection of said shank portion, is provided with a vertically offset portion, whereby when said over-molded insert is positioned in said aperture, said vertically offset portion contacts said substrate.

59. The method of claim 58, wherein said contacts are formed at an angle relative to said substrate, and said contacts are bent away from said vertically offset portion.

60. The method of claim 50, further comprising the step of providing a housing in a surrounding relation to said rigid substrate, to surround said upper contact portions.

61. The method of claim 60, wherein said housing is provided by overmolding said housing to said rigid substrate.

62. An LGA interconnect, comprising a substrate and a plurality of contact assemblies, said substrate having a plurality of apertures therethrough arranged in an array, each said contact assembly comprised of at least one metal contact and an insulative member attached to and overmolded on said metal contact, said insulative member being positioned in said aperture, positioning a first contact member of said metal contact above said substrate and a second contact of said metal contact below said substrate, said insulative member isolating said metal contact from said substrate, and retaining said contact assembly to said substrate, said metal contact being comprised of an intermediate base portion with said first and second contact members extending from opposite ends thereof with said insulative member is overmolded at said intermediate portion, and said overmolded insulative member having a head portion larger than said aperture and a shank portion profiled to be received in said aperture.

63. The LGA interconnect of claim 62, wherein said overmolded insulative member is made of plastic material.

64. The LGA interconnect of claim 62, wherein said shank portion comprises a slot profiled to be received in an edge of said substrate, adjacent said aperture.

65. The LGA interconnect of claim 64, wherein the shank portion of said overmolded insulative member is swaged, with said slot in an overlapping position with said edge of said aperture, and said shank portion is deformed against said substrate, retaining said overmolded insulative member and said contact within said aperture.

66. An LGA interconnect, comprising a substrate and a plurality of contact assemblies, said substrate having a plurality of apertures therethrough arranged in an array, each said contact assembly comprised of at least one metal contact and an insulative member attached to and overmolded on said metal contact, said insulative member being positioned in said aperture, positioning a first contact member of said metal contact above said substrate and a second contact of said metal contact below said substrate, said insulative member isolating said metal contact from said substrate, said first and second contact members extend as cantilever beams from said insulative member.

67. The LGA interconnect of claim 66, wherein said contact assemblies are arranged on said substrate with said cantilever beams oriented at an angle as measured about an axial centerline through said apertures, which is normal to said substrate.

68. The LGA interconnect of claim 67, wherein said angle is approximately 45 degrees.

69. The LGA interconnect of claim 67, wherein said contact assemblies are arranged in at least two arrays with the cantilever beams extending opposed.

70. The LGA interconnect of claim 69, wherein said contact assemblies are arranged in quadrants, with all cantilever portions projecting generally towards a geometrical center of said substrate.

71. The LGA interconnect of claim 69, said at least two arrays are aligned along at least one diagonal line across said substrate.

72. The LGA interconnect of claim 71, wherein said at least two arrays are aligned along plural diagonal lines.

73. The LGA interconnect of claim 71, wherein each insulative member comprises plural metal contacts positioned therein.

* * * * *